United States Patent
Sakiyama et al.

(10) Patent No.: US 7,498,865 B2
(45) Date of Patent: Mar. 3, 2009

(54) SEMICONDUCTOR INTEGRATED CIRCUIT WITH REDUCED SPEED VARIATIONS

(75) Inventors: Shiro Sakiyama, Yawata (JP);
Masayoshi Kinoshita, Settsu (JP);
Masaya Sumita, Amagasaki (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/511,165

(22) PCT Filed: Feb. 19, 2004

(86) PCT No.: PCT/JP2004/001942

§ 371 (c)(1),
(2), (4) Date: Oct. 14, 2004

(87) PCT Pub. No.: WO2004/077673

PCT Pub. Date: Oct. 9, 2004

(65) Prior Publication Data

US 2005/0162212 A1     Jul. 28, 2005

(30) Foreign Application Priority Data

Feb. 25, 2003 (JP) .............................. 2003-047418

(51) Int. Cl.
*H03K 3/01* (2006.01)
(52) U.S. Cl. ...................................... 327/534; 327/535
(58) Field of Classification Search ................ 327/534, 327/536, 353, 537, 535
See application file for complete search history.

(56) References Cited

U.S. PATENT DOCUMENTS

| | | | | |
|---|---|---|---|---|
| 4,427,935 A | * | 1/1984 | Bowden | ..................... 323/280 |
| 4,670,670 A | * | 6/1987 | Shoji | .......................... 327/543 |
| 4,918,336 A | * | 4/1990 | Graham et al. | .............. 326/117 |
| 5,397,934 A | * | 3/1995 | Merrill et al. | ................ 327/537 |
| 5,682,118 A | * | 10/1997 | Kaenel et al. | ................ 327/534 |
| 5,883,544 A | * | 3/1999 | So et al. | ...................... 327/537 |
| 6,124,725 A | * | 9/2000 | Sato | ........................... 324/765 |
| 6,124,752 A | * | 9/2000 | Kuroda | ....................... 327/534 |
| 6,262,622 B1 | * | 7/2001 | Lee et al. | ..................... 327/543 |
| 6,275,090 B1 | * | 8/2001 | Burger et al. | ............... 327/334 |

(Continued)

FOREIGN PATENT DOCUMENTS

JP          8-330921 A          12/1996

(Continued)

OTHER PUBLICATIONS

MacEachern, L., & Manku, T., RF and Microwave Semiconductor Device Handbook, 2003, CRC Press LLC, pp. 6-5 to 6-7.*

*Primary Examiner*—Donovan Lincoln
*Assistant Examiner*—Thomas J Hiltunen
(74) *Attorney, Agent, or Firm*—McDermott Will & Emery LLP

(57) ABSTRACT

In a semiconductor integrated circuit of the present invention, the main circuit 2 includes MOS transistors in which the source and the substrate are separated from each other. The substrate potential control circuit 1 controls the substrate potential of the MOS transistors of the main circuit 2 so that the actual saturation current value of the MOS transistors of the main circuit 2 is equal to the target saturation current value Ids under the operating power supply voltage Vdd of the main circuit 2. Therefore, it is possible to suppress variations in the operation speed even if the operating power supply voltage of the semiconductor integrated circuit is reduced.

5 Claims, 18 Drawing Sheets

U.S. PATENT DOCUMENTS

| | | | |
|---|---|---|---|
| 6,456,157 B1 * | 9/2002 | Forbes et al. | 327/543 |
| 6,466,077 B1 * | 10/2002 | Miyazaki et al. | 327/534 |
| 6,525,594 B2 * | 2/2003 | Fugate et al. | 327/534 |
| 6,794,928 B2 * | 9/2004 | Lei | 327/538 |
| 2002/0100921 A1 * | 8/2002 | Mabuchi et al. | 257/222 |
| 2003/0197546 A1 * | 10/2003 | Sim et al. | 327/534 |
| 2004/0070440 A1 * | 4/2004 | Tang et al. | 327/534 |
| 2004/0135621 A1 * | 7/2004 | Sumita et al. | 327/534 |
| 2005/0052219 A1 * | 3/2005 | Butler et al. | 327/534 |
| 2005/0093611 A1 * | 5/2005 | Fujita et al. | 327/534 |
| 2005/0116765 A1 * | 6/2005 | Sakiyama et al. | 327/534 |
| 2006/0125551 A1 * | 6/2006 | Sumita et al. | 327/534 |

FOREIGN PATENT DOCUMENTS

| | | |
|---|---|---|
| JP | 9-129831 A | 5/1997 |
| JP | 2001-217692 A | 8/2001 |

* cited by examiner

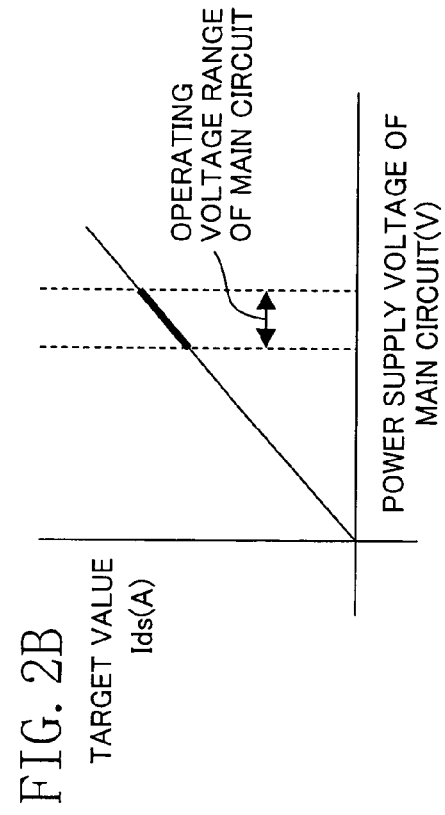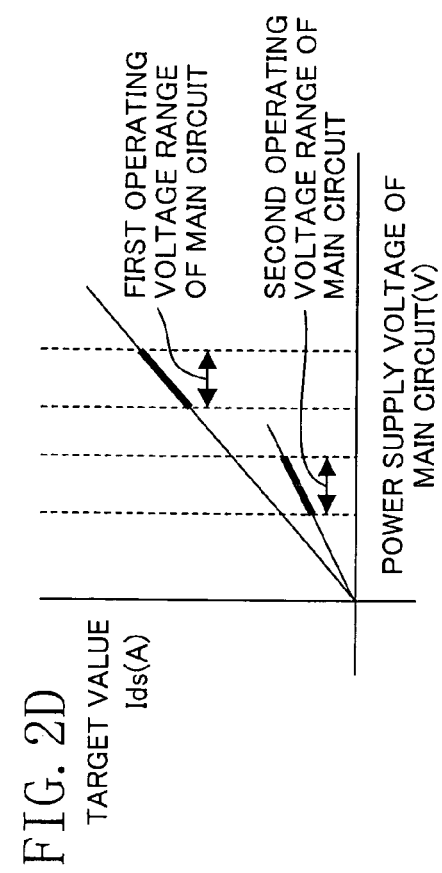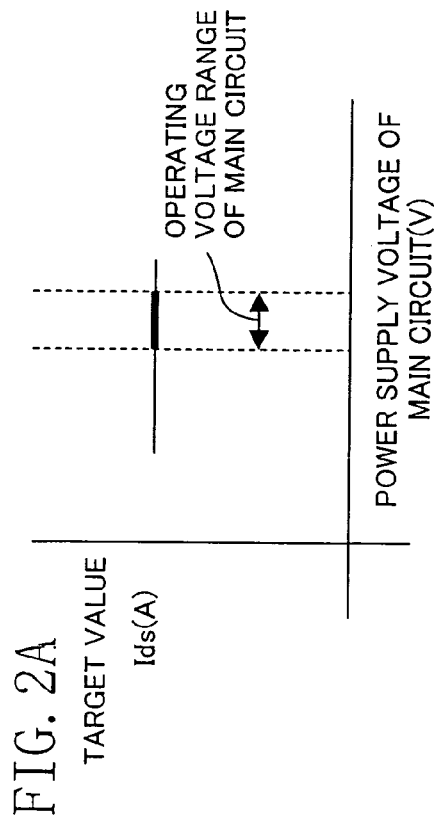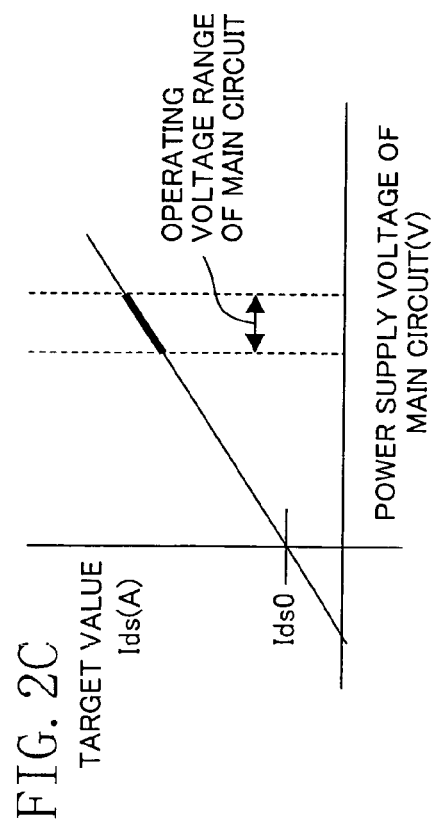

SEMICONDUCTOR INTEGRATED CIRCUIT WITH REDUCED SPEED VARIATIONS

TECHNICAL FIELD

The present invention relates to a technology for suppressing variations in the operation speed of various types of semiconductor integrated circuits including a plurality of MOS transistors in which the source and the substrate are separated from each other.

BACKGROUND ART

There is a demand for a semiconductor integrated circuit including MOS transistors to operate at a lower voltage because the transistor withstand voltage has been lowering due to process rules becoming finer and so as to meet the demand for reducing the power consumption. However, when operating at lower voltages, the operation speed of a semiconductor integrated circuit typically varies more significantly due to variable factors in the manufacturing process, such as the transistor threshold voltage, the oxide film thickness, the mobility and the process precision, changes in the ambient temperature, etc. Variations in the operation speed decrease the production yield of semiconductor integrated circuits and increase the cost thereof.

A conventional approach to reducing variations in the threshold voltage from the manufacturing process is the technology for controlling the substrate voltage of a transistor as disclosed in Japanese Laid-Open Patent Publication No. 9-129831, for example. This is a technology for controlling the substrate potential of a MOS transistor so as to bring the threshold voltage closer to a predetermined voltage value.

Expression 1 below shows the relationship between the threshold voltage Vt and the substrate potential Vb of a MOS transistor.

$$Vt = Vto + \gamma(\sqrt{(\alpha - Vb)}) \quad \text{(Expression 1)}$$

In Expression 1, Vto, α and γ are each a constant dependent on how successful the manufacturing process was. Vb is the voltage difference between the source of the MOS transistor and the substrate, and the difference is referred to as the "substrate potential". It can be seen from Expression 1 that the threshold voltage Vt increases or decreases when the substrate potential Vb is controlled to be a negative voltage or a positive voltage, respectively. Referring to FIG. 14, the relationship between the variation in the threshold voltage Vt and the control voltage of the substrate potential Vb will be described briefly. Consider how to control the threshold voltage Vt to be always at a predetermined value V1 for a variation range (V1− to V1+) of the threshold voltage Vt. The threshold voltage Vt can be adjusted to the predetermined value V1 by controlling the substrate potential Vb to be 0 V, V−(V) or V+(V) when the threshold voltage Vt is equal to V1 (the predetermined value), V1− (the lower limit of the variation range) or V1+ (the upper limit of the variation range), respectively. This can be done with a circuit configuration in which the predetermined value V1 is produced as a reference voltage, and the substrate potential Vb is adjusted by a feedback control so that the threshold voltage Vt of the MOS transistor is equal to the predetermined value V1.

With this conventional approach using such a configuration, it is possible to suppress variations in the threshold voltage Vt.

Problems to be Solved

However, the operation speed of a semiconductor integrated circuit using MOS transistors is varied not only by the threshold voltage Vt, but also by other variable factors in the manufacturing process (such as the oxide film thickness, the mobility and the process precision), changes in the ambient temperature around the semiconductor integrated circuit, and variations in the operating power supply voltage precision.

Variations in the operation speed of a MOS transistor circuit will now be described briefly.

Expression 2 below represents the operation speed (delay time) of a MOS transistor circuit.

$$\tau = C \cdot Vdd / Ids \quad \text{(Expression 2)}$$

In Expression 2 above, τ is the delay time of a MOS transistor circuit such as a logic gate, C is the load capacitance, Vdd is the operating power supply voltage of the MOS transistor circuit, Ids is the saturation current value of the MOS transistor under the operating power supply voltage. Therefore, in order to keep the operation speed of a MOS transistor circuit constant, it is important to suppress variations in the saturation current value Ids of the MOS transistors.

Typically, the saturation current of a MOS transistor is as shown in Expression 3 below.

$$Ids = (1/2)\mu Cox(W/L)(Vdd - Vt)^2 \quad \text{(Expression 3)}$$

In Expression 3 above, Ids is the saturation current value of a MOS transistor, μ is the mobility, Cox is the gate capacitance per unit area, W is the gate width of the MOS transistor, L is the gate length of the MOS transistor, Vdd is the operating power supply voltage of the MOS transistor circuit, and Vt is the threshold voltage of the MOS transistor.

As can be seen from Expression 3 above, the saturation current Ids of a MOS transistor may vary depending on a number of variable factors, in addition to the threshold voltage Vt, such as the mobility μ (which is dependent on the ion dose precision), the gate capacitance Cox (which is dependent on the gate oxide film thickness precision), and the value W/L (which is dependent on the process precision). Moreover, the saturation current Ids of a MOS transistor may also be varied by changes in the threshold voltage Vt or the mobility μ caused by the ambient temperature during operation of the MOS transistor.

Referring to FIG. 13(a), FIG. 13(b) and FIG. 13(c), how the saturation current Ids of a MOS transistor is varied by the variable factors will now be described.

FIG. 13(a) shows the saturation current Ids of a MOS transistor with respect to the operating power supply voltage Vdd where only the threshold voltage Vt shown in Expression 3 varies. If the threshold voltage Vt is higher than a predetermined medium value of the threshold voltage Vt, the curve shifts in the positive direction in which the operating power supply voltage Vdd increases, thereby lowering the saturation current value Ids of the MOS transistor at an operating power supply voltage Vdd1. If the threshold voltage Vt is lower than the predetermined medium value of the threshold voltage Vt, the curve shifts in the negative direction in which the operating power supply voltage Vdd decreases, thereby increasing the saturation current value Ids of the MOS transistor at the operating power supply voltage Vdd1.

FIG. 13(b) shows the saturation current Ids of a MOS transistor with respect to the operating power supply voltage Vdd where the value μCox (W/L) in shown in Expression 3 varies. If the value μCox(W/L) is larger than a predetermined medium value thereof, the gradient of the parabolic curve increases, thereby increasing the saturation current value Ids of the MOS transistor at the operating power supply voltage Vdd1. If the value μCox(W/L) is smaller than the predetermined medium value thereof, the gradient of the parabolic curve decreases, thereby decreasing the saturation current value Ids of the MOS transistor at the operating power supply voltage Vdd1.

FIG. 13(c) shows the saturation current Ids of a MOS transistor with respect to the operating power supply voltage Vdd where the ambient temperature varies. In Expression 3, the mobility μ and the threshold voltage Vt are temperature-dependent, and they both typically decrease as the temperature increases. Therefore, under a relatively high operating power supply voltage Vdd1, where a decrease in the mobility μ has greater influence, if the temperature increases, the saturation current value Ids of the MOS transistor decreases. However, under a relatively low operating power supply voltage Vdd2, where a decrease in the threshold voltage Vt has greater influence, if the temperature increases, the saturation current value Ids of the MOS transistor increases. Thus, the saturation current value Ids is influenced by a change in the temperature differently depending on the operating power supply voltage value Vdd.

As described above, the saturation current value Ids of a MOS transistor may vary depending on a number of variable factors other than the threshold voltage Vt. Therefore, it can be seen that the conventional approach in which variations in the threshold voltage Vt are suppressed may not sufficiently suppress variations in the operation speed of a MOS transistor circuit.

DISCLOSURE OF THE INVENTION

It is therefore an object of the present invention to provide a semiconductor integrated circuit in which variations in the operation speed of a main circuit including a MOS transistor are effectively suppressed, despite variations in variable factors, including not only the threshold voltage Vt, but also other factors in the manufacturing process of the MOS transistor, e.g., the mobility μ, the gate capacitance Cox per unit area, and the ratio W/L between the gate width W and the gate length L, and changes in the operating ambient temperature, thus improving the production yield and the operation speed of the semiconductor integrated circuit.

In order to achieve the object set forth above, the present invention provides a semiconductor integrated circuit in which the actual saturation current value of a MOS transistor of a main circuit thereof is controlled to be substantially at a constant value, thus suppressing variations thereof, thereby improving the operation speed of the semiconductor integrated circuit.

Specifically, a semiconductor integrated circuit of the present invention is a semiconductor integrated circuit, including: a main circuit including a plurality of transistors of a MOS structure in which a source potential and a substrate potential are separated from each other, and operating while receiving a predetermined operating power supply voltage; and a substrate potential control circuit for controlling the substrate potential of each MOS transistor of the main circuit, wherein: a target saturation current value of the MOS transistor under the operating power supply voltage value of the main circuit is set in the substrate potential control circuit; and the substrate potential control circuit controls the substrate potential of each MOS transistor of the main circuit so that an actual saturation current value of the MOS transistor under the operating power supply voltage value of the main circuit is equal to the target saturation current value.

In one embodiment of the semiconductor integrated circuit, where a predetermined operating power supply voltage of the main circuit varies within a predetermined operating voltage range, the target saturation current value of the MOS transistors of the main circuit is proportional to the operating power supply voltage value within the operating voltage range.

In one embodiment of the semiconductor integrated circuit, where a predetermined operating power supply voltage of the main circuit varies within a predetermined operating voltage range, the target saturation current value of the MOS transistors of the main circuit is in a linear function relationship with the operating power supply voltage value within the operating voltage range.

In one embodiment of the semiconductor integrated circuit, the main circuit has a plurality of operating power supply voltage ranges; the target saturation current value of the MOS transistors of the main circuit is in a linear function relationship with the operating power supply voltage value within an operating voltage range for each operating power supply voltage range of the main circuit; and the linear function relationship between the target saturation current value and the operating power supply voltage value is different for each operating power supply voltage range.

In one embodiment of the semiconductor integrated circuit, the substrate potential control circuit controls the substrate potential of an nMOS transistor or that of a pMOS transistor among all the MOS transistors of the main circuit.

A semiconductor integrated circuit of the present invention is a semiconductor integrated circuit, including: a main circuit including a plurality of transistors of a MOS structure in which a source potential and a substrate potential are separated from each other, and operating while receiving a predetermined operating power supply voltage; and a substrate potential control circuit for controlling the substrate potential of each MOS transistor of the main circuit so that an actual saturation current value of the MOS transistor under the operating power supply voltage value of the main circuit is equal to a target saturation current value, the substrate potential control circuit, including: a constant current generation circuit; a current-voltage conversion circuit including a MOS transistor provided therein and having current-voltage conversion characteristics that change according to the substrate potential of the MOS transistor provided therein for converting a constant current value of the constant current generation circuit to a voltage value; and a differential amplifier circuit for controlling a substrate potential of the current-voltage conversion circuit so that the converted voltage value from the current-voltage conversion circuit is equal to the predetermined operating power supply voltage value of the main circuit, wherein the substrate potential control circuit controls the substrate potential of each MOS transistor of the main circuit so that the substrate potential is equal to the substrate potential of the current-voltage conversion circuit controlled by the differential amplifier circuit.

In one embodiment of the semiconductor integrated circuit, where the predetermined operating power supply voltage of the main circuit varies within a predetermined operating voltage range, the constant current value of the constant current generation circuit is proportional to the operating power supply voltage value within the operating voltage range.

In one embodiment of the semiconductor integrated circuit, where the predetermined operating power supply voltage of the main circuit varies within a predetermined operating voltage range, the constant current value of the constant current generation circuit is in a linear function relationship with the operating power supply voltage value within the operating voltage range.

In one embodiment of the semiconductor integrated circuit, the main circuit has a plurality of operating power supply voltage ranges; the constant current value of the constant current generation circuit is in a linear function relationship with an operating power supply voltage value within an operating voltage range for each operating power supply voltage range of the main circuit; and the linear function relationship between the constant current value of the constant current generation circuit and the operating power supply voltage value is different for each operating power supply voltage range.

In one embodiment of the semiconductor integrated circuit, the constant current generation circuit generates a plurality of constant current values, and selectively outputs one of the plurality of constant current values.

In one embodiment of the semiconductor integrated circuit, the constant current generation circuit generates a constant current with a variation rate smaller than that for the actual saturation current value of the MOS transistors of the main circuit.

In one embodiment of the semiconductor integrated circuit, the constant current generation circuit includes an adjustment circuit for reducing variations in the generated constant current value.

A semiconductor integrated circuit of the present invention is a semiconductor integrated circuit, including: a main circuit including a plurality of transistors of a MOS structure, and operating while receiving an operating power supply voltage; and a power supply voltage control circuit for controlling the operating power supply voltage supplied to the main circuit, wherein: a target saturation current value of the MOS transistors of the main circuit is set in the power supply voltage control circuit; and the power supply voltage control circuit controls a voltage value of the operating power supply voltage supplied to the main circuit so that an actual saturation current value of the MOS transistors of the main circuit is equal to the target saturation current value.

In one embodiment of the semiconductor integrated circuit, the target saturation current value of the MOS transistors of the main circuit is a target saturation current value of an nMOS transistor or that of a pMOS transistor from among the MOS transistors of the main circuit, or is an average value between the target saturation current values of the NMOS and pMOS transistors.

In one embodiment of the semiconductor integrated circuit, the target saturation current value of the MOS transistors of the main circuit is in a linear function relationship with the operating power supply voltage supplied to the main circuit.

In one embodiment of the semiconductor integrated circuit, the main circuit includes a plurality of operating power supply voltage ranges; the target saturation current value of the MOS transistors of the main circuit is in a linear function relationship with an operating power supply voltage value within an operating voltage range for each operating power supply voltage range of the main circuit; the linear function relationship between the target saturation current value and the operating power supply voltage value is different for each operating power supply voltage range.

Thus, in the present invention, while the operation speed (delay time) of the MOS transistors of the main circuit is a function of the saturation current of the MOS transistors, the substrate potential control circuit controls the substrate potential of the MOS transistors so that the actual saturation current of the MOS transistors is equal to the target saturation current value during the operation of the main circuit. Therefore, even if the threshold voltage, the mobility $\mu$, the gate capacitance Cox per unit area or the ratio W/L between the gate width W and the gate length L varies due to variations in the manufacturing process of the MOS transistors or changes in the ambient temperature occur during the operation of the main circuit, the saturation current of the MOS transistors, which would otherwise vary due to such variations or changes, is controlled to be substantially constant, whereby variations in the operation speed of the MOS transistors of the main circuit are effectively suppressed.

Moreover, in the present invention, while the operation speed of the MOS transistors is proportional to the relationship (Vdd/Ids) between the operating power supply voltage Vdd and the actual saturation current Ids of the MOS transistors, as can be seen from Expression 2, even if the operating power supply voltage of the main circuit varies, the target saturation current value is changed in proportion to the variation, whereby variations in the operation speed of the MOS transistors due to changes in the operating power supply voltage of the main circuit can also be suppressed effectively. This is particularly advantageous for inverter circuits.

Particularly, in the present invention, the relationship between the target saturation current value and the operating power supply voltage of the main circuit is set to be a linear function relationship, whereby the operation speed of the main circuit can be controlled to be substantially at a constant value, whereby variations in the operation speed can be suppressed even more effectively. This is particularly advantageous for memory devices and multi-level stacked logic circuits.

Moreover, in the present invention, where the main circuit has a plurality of operating power supply voltage ranges selectively used depending on the operation mode, or the like, the relationship between the target saturation current value and the operating power supply voltage of the main circuit is set to be a linear function relationship separately for each operating power supply voltage range, whereby variations in the operation speed can be effectively suppressed for each of the operating power supply voltage ranges of the main circuit. This is particularly advantageous for main circuits having different operating power supply voltages for different operation modes.

In addition, in the present invention, the variation rate for the target saturation current value is sufficiently smaller than that for the saturation current of the MOS transistors where it is not controlled, whereby variations in the operation speed of the main circuit can be suppressed.

Moreover, in the present invention, since an adjustment circuit for reducing the variations in the target saturation current value is provided, the variations in the target saturation current value are even more restricted by the adjustment circuit, whereby variations in the operation speed of the main circuit can be even more suppressed.

Furthermore, in the present invention, even if various factors such as the gate capacitance per unit area, the gate width and the mobility vary due to variations in the manufacturing process of the MOS transistors provided in the main circuit, the delay time can be kept constant, and a design with a small margin is made possible. Therefore, it is not necessary to, as in the prior art, set the operating power supply voltage of the main circuit to be high taking into consideration variations in various factors such as the mobility, and the operating power supply voltage can be determined with only a small power supply margin, whereby the main circuit can be operated at a low voltage, thus further reducing the power consumption. Particularly, in the present invention, an operating power supply voltage with a small power supply margin is set for each of the operating power supply voltage ranges corresponding to various operation modes of the main circuit,

BRIEF DESCRIPTION OF THE DRAWINGS

FIG. 2(a) to FIG. 2(d) each show the relationship between the target saturation current value and the operating power supply voltage of the main circuit, wherein FIG. 2(a) shows a case where the target saturation current value is constant in the operating voltage range of the main circuit, FIG. 2(b) a case where the target saturation current value is proportional to the operating power supply voltage in the operating voltage range of the main circuit, FIG. 2(c) a case where the target saturation current value is proportional to the operating power supply voltage with a predetermined offset in the operating voltage range of the main circuit, and FIG. 2(d) a case where the main circuit has two operating voltage ranges.

FIG. 8(a) to FIG. 8(d) each show the relationship between the constant current value of the constant current generation circuit and the operating power supply voltage of the main circuit, wherein FIG. 8(a) shows a case where the constant current value is constant in the operating voltage range of the main circuit, FIG. 8(b) a case where the constant current value is proportional to the operating power supply voltage in the operating voltage range of the main circuit, FIG. 8(c) a case where the constant current value is proportional to the operating power supply voltage with a predetermined offset in the operating voltage range of the main circuit, and FIG. 8(d) a case where the main circuit has two operating voltage ranges.

FIG. 10(a) to FIG. 10(c) each show a configuration of a current-voltage conversion circuit provided in the substrate potential control circuit for controlling the substrate voltage of the nMOS transistors of the main circuit, wherein FIG. 10(a) shows a basic configuration, FIG. 10(b) a first variation thereof, and FIG. 10(c) a second variation thereof.

FIG. 12(a) to FIG. 12(c) each show a configuration of a current-voltage conversion circuit provided in the substrate potential control circuit for the pMOS transistors of the main circuit, wherein FIG. 12(a) shows a basic configuration, FIG. 12(b) a first variation thereof, and FIG. 12(c) a second variation thereof.

FIG. 13(a) to FIG. 13(c) each show the characteristics of the saturation current with respect to the operating power supply voltage in a MOS transistor, wherein FIG. 13(a) shows the characteristics where the threshold voltage varies, FIG. 13(b) the characteristics where $\mu\text{Cox}(W/L)$ (where $\mu$ is the mobility, Cox the gate capacitance per unit area, W the gate width of the MOS transistor and L the gate length thereof) varies, and FIG. 13(c) the characteristics where the ambient temperature varies.

BEST MODE FOR CARRYING OUT THE INVENTION

A semiconductor integrated circuit according to an embodiment of the present invention will now be described with reference to the drawings.

First Embodiment

Figure 1:
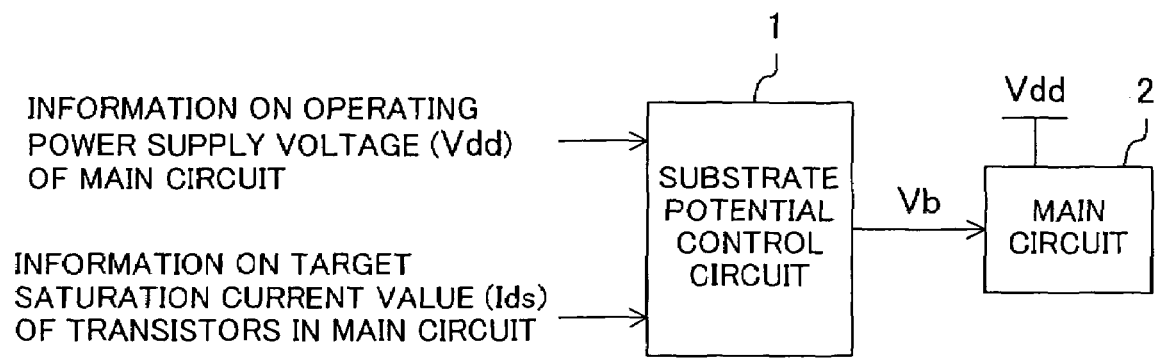
FIG. 1 shows a basic configuration of a semiconductor integrated circuit according to the first embodiment of the present invention.

FIG. 1 shows a configuration of the semiconductor integrated circuit of the present embodiment. In the figure, reference numeral 2 denotes a main circuit that operates while receiving the operating power supply voltage Vdd and includes a large number of MOS transistors (not shown). The source of each of these MOS transistors is not electrically connected to the substrate, whereby the source potential and the substrate potential are separated from each other.

Reference numeral 1 denotes a substrate potential control circuit that is receiving information on the operating power supply voltage Vdd of the main circuit 2 and information on the target saturation current value Ids of the MOS transistors of the main circuit 2 operating under the operating power supply voltage Vdd. The substrate potential control circuit 1 controls the substrate potential Vb of the MOS transistors of the main circuit 2 so that the actual saturation current of the MOS transistors of the main circuit 2 under the operating power supply voltage Vdd of the main circuit 2 is equal to the given target saturation current value Ids.

Thus, the substrate potential control circuit 1 controls the substrate potential Vb so that the actual saturation current value of the MOS transistors of the main circuit 2 is always equal to the target saturation current value Ids, whereby the main circuit 2 always operates at a constant operation speed even if there are variations in the MOS transistor manufacturing process or changes in the temperature.

Thus, a feature of the present embodiment is that the variations in the saturation current value Ids of the MOS transistors themselves, which determine the delay time $\tau$ shown in Expression 2 above, are suppressed by controlling the substrate potential of the MOS transistors.

FIG. 2(*a*) to FIG. 2(*d*) show various examples of the relationship between the operating power supply voltage Vdd of the main circuit 2 in the semiconductor integrated circuit shown in FIG. 1 and the target saturation current value Ids.

FIG. 2(*a*) shows an example where the target saturation current value Ids of the MOS transistors is kept constant, irrespective of the operating power supply voltage Vdd of the main circuit 2. As shown in Expression 2 above, the delay time $\tau$ of a MOS transistor circuit increases in proportion to the operating power supply voltage Vdd assuming that the saturation current value Ids of the MOS transistors is constant. However, in a case where the precision of the power supply voltage of the main circuit 2 is high, the delay time varies little, whereby the present embodiment is very effective.

FIG. 2(*b*) shows an example where the relationship between the target saturation current value Ids of the MOS transistors and the operating power supply voltage Vdd of the main circuit 2 is proportional. With this relationship, there is provided a significant advantage that the operation speed of the main circuit 2 can be kept substantially constant even if the operating power supply voltage Vdd of the main circuit 2 changes. As can be seen from Expression 2 above, in order to keep the operation speed of a MOS transistor circuit constant, it is of course preferred to reduce the variations in the saturation current value Ids of the MOS transistors, but it is more preferred that the saturation current value Ids, which is proportional to the operating power supply voltage Vdd as shown in Expression 5, is used as a target value.

$$Ids = k \cdot Vdd \quad \text{(Expression 5)}$$

In Expression 5, Ids is the saturation current value of the MOS transistors, k is a constant, and Vdd is the operating power supply voltage of the main circuit 2. Substituting Expression 5 into Expression 2 yields that the delay time $\tau$ is equal to C/k, indicating that it is possible to obtain a constant operation speed, independent of variations in the characteristics of the MOS transistors, changes in the temperature, and the operating power supply voltage Vdd. Note however that Expression 2 is an approximate expression effective for simple logic circuits such as inverter circuits.

In a memory device, a multi-level stacked logic circuit, or the like, the delay time $\tau$ influences not only the saturation currents of the MOS transistors stacked together but also on the ON resistances thereof. Therefore, it is preferred to determine, on a circuit by circuit basis, an optimal linear relationship for obtaining an operation speed that is constant against changes in the operating power supply voltage, as shown in FIG. 2(*c*). FIG. 2(*c*) shows an example where the relationship between the target saturation current value Ids of the MOS transistors and the operating power supply voltage Vdd of the main circuit 2 is a proportional relationship with an offset current Ids0.

FIG. 2(*d*) shows that where the main circuit 2 has a plurality of (two in the figure) operating power supply voltage ranges, the target saturation current value Ids is in a linear function relationship with the operating power supply voltage Vdd of the main circuit 2 for each of the first and second operating power supply voltage ranges and that the linear function relationships (the gradients of the linear functions) of the operating power supply voltage ranges are different from each other. In a case where there are, for example, two operating power supply voltages Vdd to be applied to the main circuit 2 and each operating power supply voltage is associated with a different operation speed, the relationship as shown by the graph of FIG. 2(*d*) is more advantageous in terms of the power consumption, particularly, the reduction in the transistor leak current.

Figure 3:
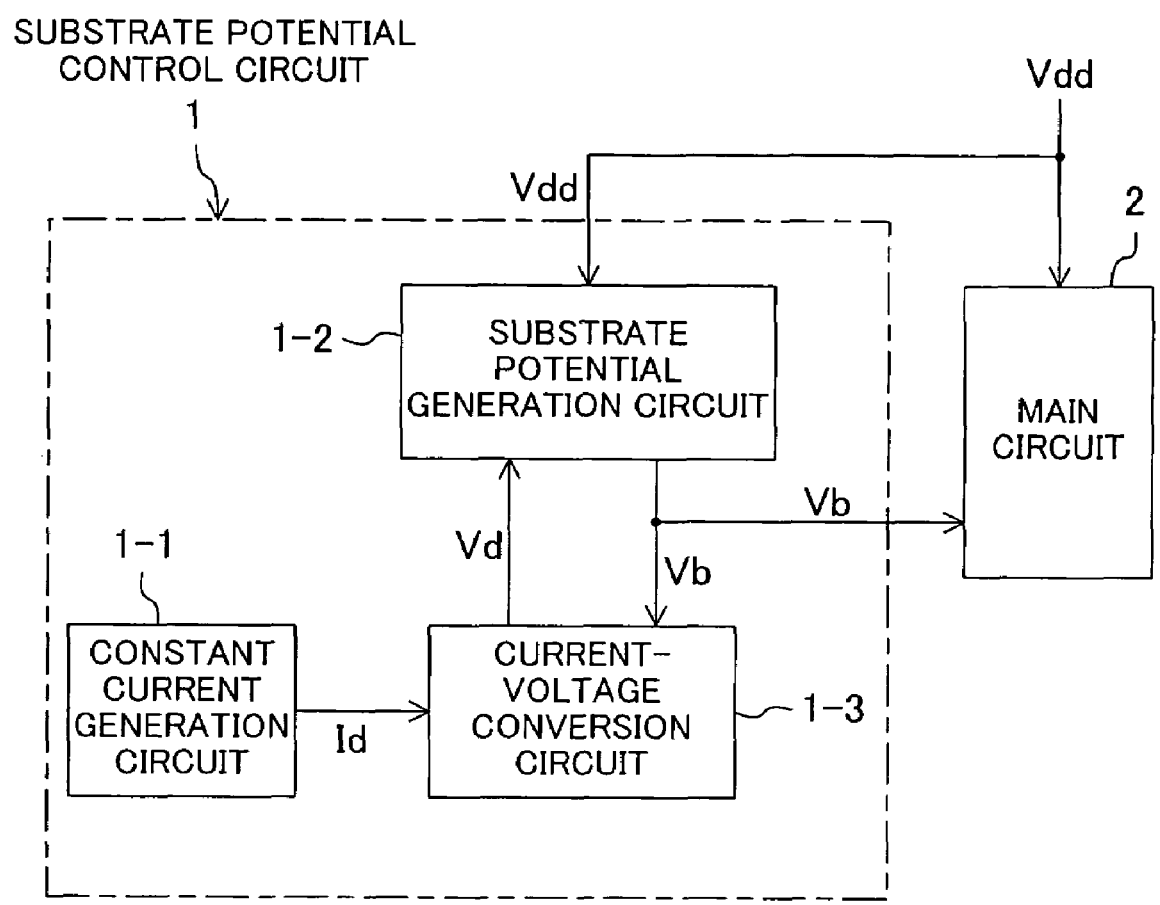
FIG. 3 shows a specific configuration of a substrate potential control circuit provided in the semiconductor integrated circuit of the first embodiment.

FIG. 3 shows an exemplary specific configuration of the substrate potential control circuit 1 in the semiconductor integrated circuit shown in FIG. 1. The semiconductor integrated circuit shown in FIG. 3 includes the substrate potential control circuit 1 and the main circuit 2, as does that shown in FIG. 1.

The substrate potential control circuit 1 includes a constant current generation circuit 1-1, a substrate potential generation circuit 1-2 and a current-voltage conversion circuit 1-3. The current-voltage conversion circuit 1-3 includes a MOS transistor provided therein, and the current-voltage conversion characteristics thereof can be changed by changing the substrate potential Vb of the MOS transistor provided therein. The constant current generation circuit 1-1 outputs a constant current Id, and the constant current Id is input to the current-voltage conversion circuit 1-3. The current-voltage conversion circuit 1-3 converts the constant current Id to a voltage Vd, and outputs the voltage Vd to the substrate potential generation circuit 1-2. The substrate potential generation circuit 1-2 receives the operating power supply voltage Vdd of the main circuit 2 and the converted voltage Vd from the current-voltage conversion circuit 1-3, and outputs a signal of the substrate potential Vb to the current-voltage conversion circuit 1-3 so that the operating power supply voltage Vdd and the converted voltage Vd are equal to each other, and the current-voltage conversion circuit 1-3 changes the current-voltage conversion characteristics thereof based on the received substrate potential Vb. The substrate potential Vb generated by the substrate potential generation circuit 1-2 is supplied to the main circuit 2 as the substrate potential Vb of the MOS transistors of the main circuit 2.

The substrate potential control circuit 1 shown in FIG. 3 is effective in controlling the substrate potentials of both nMOS transistors and pMOS transistors of the main circuit 2. Next, the substrate potential control circuit for the NMOS transistors of the main circuit 2 and the substrate potential control circuit for the pMOS transistors of the main circuit 2 will be described separately for the sake of simplicity.

Figure 4:
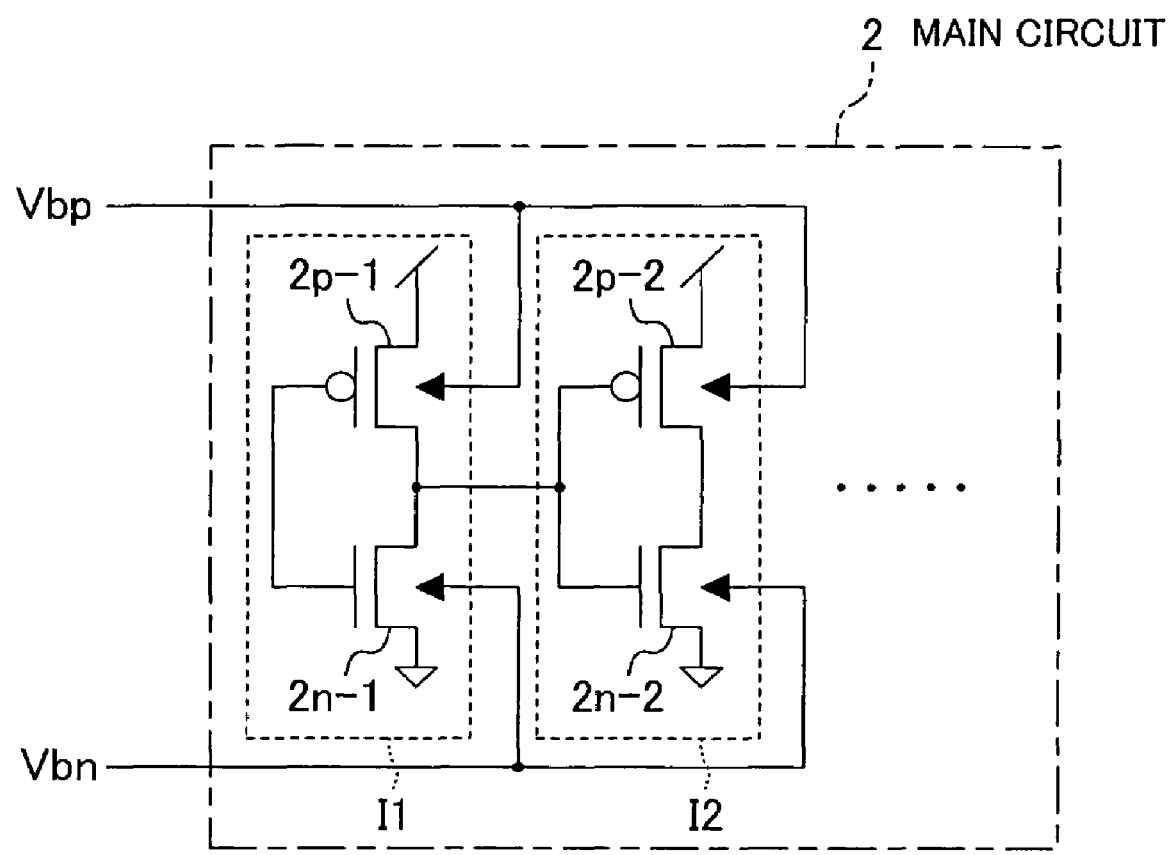
FIG. 4 shows an exemplary specific configuration of the main circuit provided in the semiconductor integrated circuit.

First, an exemplary internal configuration of the main circuit 2 will be described with reference to FIG. 4. The figure shows a case where the main circuit 2 is made up of a plurality of inverter circuits I1, I2, . . . . Reference numerals 2*n*-1 to 2*n*-2 denote the NMOS transistors in which the source potential and the substrate potential are separated from each other, and reference numerals 2*p*-1 to 2*p*-2 similarly denote the pMOS transistors in which the source potential and the substrate potential are separated from each other. A potential Vbn is provided as the substrate potential of the nMOS transistors 2*n*-1 to 2*n*-2, and a potential Vbp is provided as the substrate potential of the pMOS transistors 2*p*-1 to 2*p*-2. As shown in Expression 1 above, the threshold voltage Vtn of the nMOS transistors 2*n*-1 to 2*n*-2 can be changed by controlling the substrate potential Vbn, and the threshold voltage Vtp of the pMOS transistors 2*p*-1 to 2*p*-2 can be changed by controlling the substrate potential Vbp. Therefore, the saturation current Ids(n) of the nMOS transistors 2*n*-1 to 2*n*-2 and the saturation current Ids(p) of the pMOS transistors 2p-1 to 2p-2 can also be changed by controlling the substrate potentials Vbn and Vbp, respectively.

Figure 5:
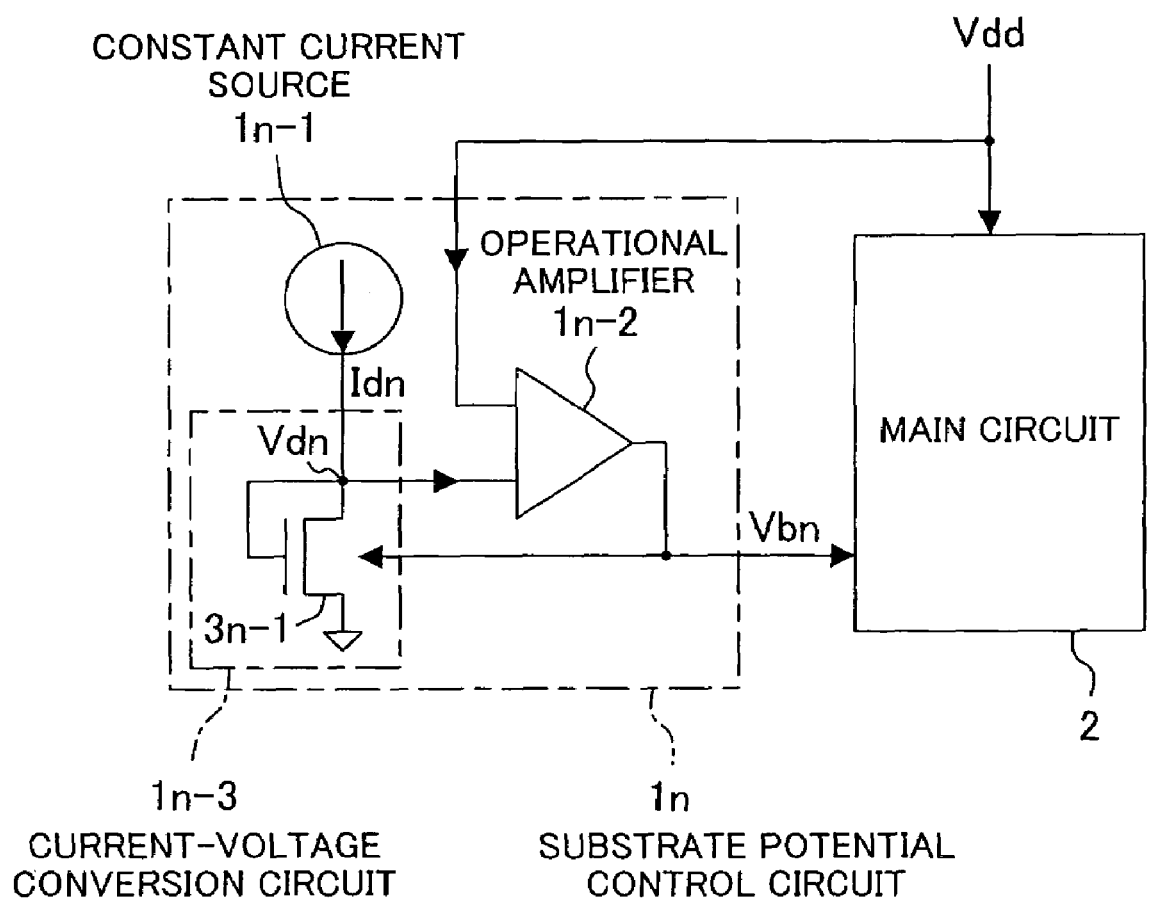
FIG. 5 shows a substrate potential control circuit for controlling, by using the substrate potential, the actual saturation current of the nMOS transistors of the main circuit of the semiconductor integrated circuit.

Next, FIG. 5 shows a semiconductor integrated circuit, showing an exemplary internal configuration of a substrate potential control circuit 1-1 for controlling the saturation current of the NMOS transistors 2n-1 to 2n-2 of the main circuit 2. The structure shown in FIG. 5 includes the main circuit 2 including the nMOS transistors 2n-1 to 2n-2, and the substrate potential control circuit In for the nMOS transistors 2n-1 to 2n-2 of the main circuit 2, as does that shown in FIG. 1. The substrate potential control circuit 1n includes a constant current source (constant current generation circuit) 1n-1, an operational amplifier (differential amplifier) 1n-2 and a current-voltage conversion circuit 1n-3. A constant current Idn output from the constant current source 1n-1 is given to the current-voltage conversion circuit 1n-3. The current-voltage conversion circuit 1n-3 converts the constant current Idn output from the constant current source 1n-1 to a voltage Vdn based on predetermined current-voltage conversion characteristics. The operational amplifier 1n-2 receives the converted voltage Vdn from the current-voltage conversion circuit 1n-3 and the operating power supply voltage Vdd of the main circuit 2, controls the substrate potential Vbn of the current-voltage conversion circuit 1n-3 so that the voltages Vdn and Vdd are equal to each other, and supplies the controlled substrate potential Vbn also to the main circuit 2 as the substrate potential Vbn of the NMOS transistors 2n-1 to 2n-2 of the main circuit 2.

The current-voltage conversion circuit 1n-3 includes an NMOS transistor 3n-1. It is preferred that the nMOS transistor 3n-1 is such that the characteristics between the substrate potential Vbn thereof and the operating power supply voltage Vdd are equal to those of the nMOS transistors 2n-1 to 2n-2 used in the main circuit 2. For example, where the gate length L is 0.13 μm, the operating power supply voltage Vdd is 1.5 V and W/L=3 μm/0.13 μm in the nMOS transistors 2n-1 to 2n-2 of the main circuit 2, if the saturation current value Ids(n) is 2 mA, it is preferred that the nMOS transistor 3n-1 used in the current-voltage conversion circuit 1n-3 has a size of W/L=3 μm/0.13 μm. In the nMOS transistor 3n-1 of the current-voltage conversion circuit 1n-3, the gate and the drain are directly connected to each other, and the constant current Idn generated in the constant current generation circuit 1n-1 is output from the drain side. As for the constant current value Idn, since the saturation current value Ids(n) of the nMOS transistors 2n-1 to 2n-2 of the main circuit 2 is 2 mA@1.5 V in the numeric example shown above, the target saturation current value is set to 2 mA@1.5 V.

The operational amplifier in-2 controls the substrate potential Vbn of the nMOS transistor 3n-1 of the current-voltage conversion circuit 1n-3 so that the converted voltage Vdn output from the current-voltage conversion circuit 1n-3 is equal to the operating power supply voltage Vdd of the main circuit 2. The controlled substrate potential Vbn is also supplied to the main circuit 2 as the substrate potential Vbn of the nMOS transistors 2n-1 to 2n-2 of the main circuit 2. Therefore, the substrate potential Vbn of the nMOS transistors 2n-1 to 2n-2 of the main circuit 2 is controlled so that the actual saturation current Ids(n) of the nMOS transistors 2n-1 to 2n-2 of the main circuit 2 when the operating power supply voltage Vdd=1.5 V is 2 mA. Where the constant current Idn of the constant current source 1n-1 stays constant, independent of changes in the operating power supply voltage Vdd, the saturation current value Ids(n) of the nMOS transistors 2n-1 to 2n-2 of the main circuit 2 is controlled to be a constant value, independent of the operating power supply voltage Vdd.

Next, a configuration of the substrate potential control circuit 1 for controlling the saturation current of the pMOS transistors 2p-1 to 2p-2 of the main circuit 2 will be described with reference to FIG. 6.

Figure 6:
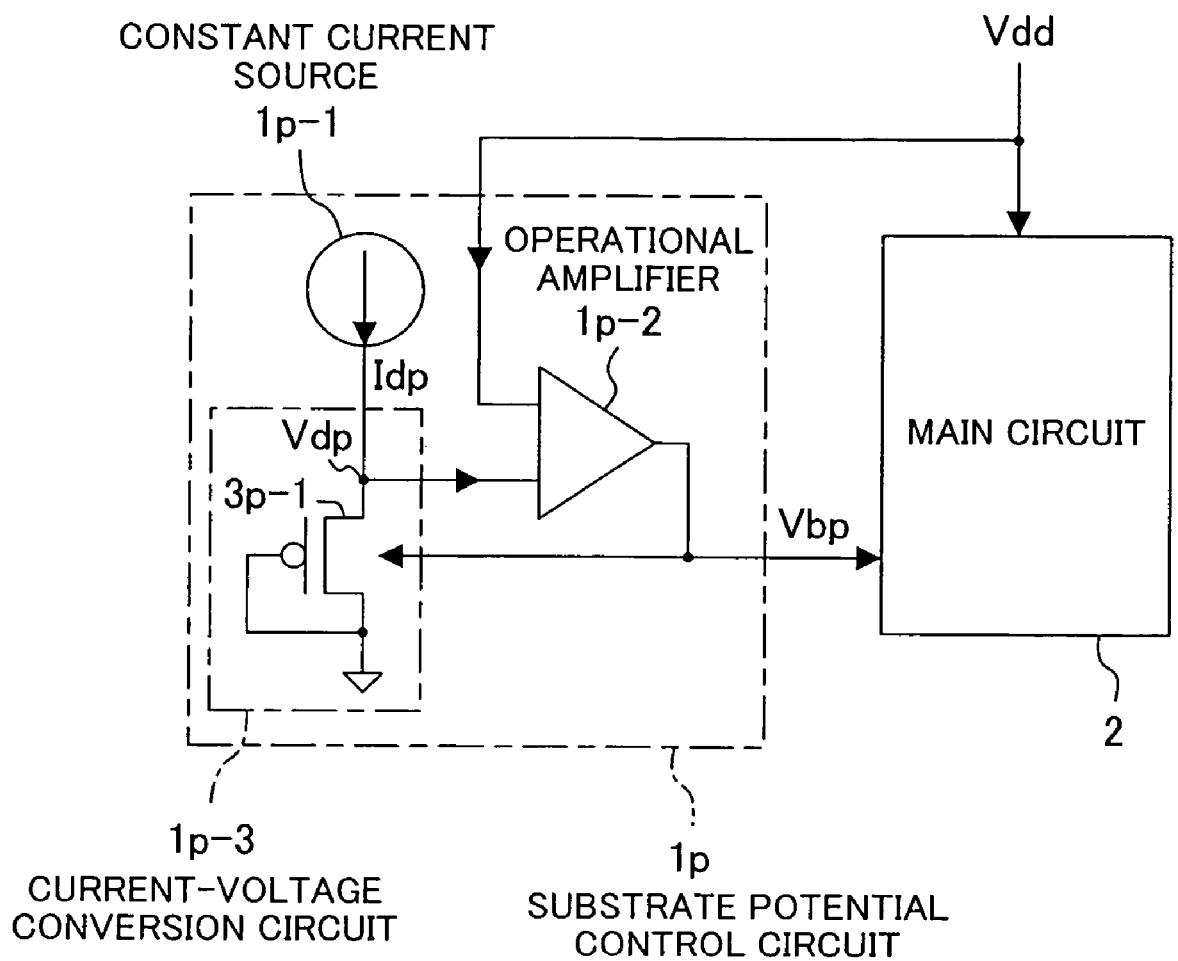
FIG. 6 shows a substrate potential control circuit for controlling, by using the substrate potential, the actual saturation current of the pMOS transistors of the main circuit of the semiconductor integrated circuit.

The structure shown in FIG. 6 includes the main circuit 2 including the pMOS transistors 2p-1 to 2p-2, and a substrate potential control circuit 1p for the pMOS transistors 2p-1 to 2p-2, as does that shown in FIG. 1. The substrate potential control circuit 1p includes a constant current source 1p-1, an operational amplifier 1p-2 and a current-voltage conversion circuit 1p-3 including a pMOS transistor 3p-1 therein. A constant current Idp output from the constant current source 1p-1 is given to the current-voltage conversion circuit 1p-3. The operational amplifier 1p-2 controls the substrate potential Vbp of the pMOS transistor 3p-1 of the current-voltage conversion circuit 1p-3 so that a converted voltage Vdp from the current-voltage conversion circuit 1p-3 is equal to the operating power supply voltage Vdd of the main circuit 2, and supplies the controlled substrate potential Vbp also to the main circuit 2 as the substrate potential Vbp of the pMOS transistors 2p-1 to 2p-2 of the main circuit 2.

It is preferred that the pMOS transistor 3p-1 in the current-voltage conversion circuit 1p-3 is such that the relationship characteristics between the substrate potential Vbp and the saturation current value Ids(p) are equal to those of the pMOS transistors 2p-1 to 2p-2 of the main circuit 2. For example, where the gate length L is 0.13 μm, the operating power supply voltage Vdd is 1.5 V and W/L=3 μm/0.13 μm in the pMOS transistors 2p-1 to 2p-2 of the main circuit 2, if the saturation current value Ids(p) is 1 mA, it is preferred that the pMOS transistor 3p-1 used in the current-voltage conversion circuit 1p-3 has a size of W/L=3 μm/0.13 μm. In the pMOS transistor 3p-1 of the current-voltage conversion circuit 1p-3, the gate and the drain are directly connected to each other, and the constant current Idp generated in the constant current source circuit 1p-1 is output from the source side. As for the constant current value Idp, since the saturation current value Ids(p) of the pMOS transistors 2p-1 to 2p-2 of the main circuit 2 is 1 mA in the numeric example shown above, the target saturation current value is set to 1 mA@1.5 V.

In the substrate potential control circuit 1p, the operational amplifier 1p-2 controls the substrate potential Vbp of the pMOS transistor 3p-1 of the current-voltage conversion circuit 1p-3 so that the converted voltage Vdp from the current-voltage conversion circuit 1p-3 is equal to the operating power supply voltage Vdd, and the controlled substrate potential Vbp is supplied also to the main circuit 2 as the substrate potential Vbp of the pMOS transistors 2p-1 to 2p-2 of the main circuit 2. Therefore, in the main circuit 2, the substrate potential Vbp is controlled so that the actual saturation current Ids(p) of the pMOS transistors 2p-1 to 2p-2 is 1 mA when the operating power supply voltage Vdd=1.5 V. Where the constant current Idp of the constant current source 1p-1 stays constant, independent of changes in the operating power supply voltage Vdd, the saturation current Ids(p) of the pMOS transistors 2p-1 to 2p-2 is controlled to be a constant value, independent of changes in the operating power supply voltage Vdd of the main circuit 2.

(Variations of Constant Current Generation Circuit of Substrate Potential Control Circuit)

FIG. 7(a) to FIG. 7(d) each show a variation of the constant current generation circuit 1-1 of the substrate potential control circuit 1. These constant current generation circuits can be used as either the constant current generation circuit 1n-1 or 1p-1.

Figure 7A:
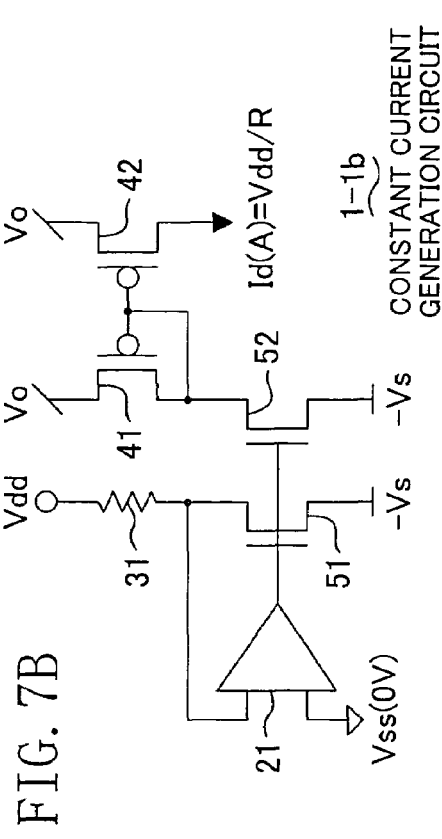
FIG. 7(a) shows an internal configuration of a constant current generation circuit provided in the substrate potential control circuit, FIG. 7(b) a first variation of the constant current generation circuit, FIG. 7(c) a second variation of the constant current generation circuit, and FIG. 7(d) a third variation of the constant current generation circuit.
Figure 8A:
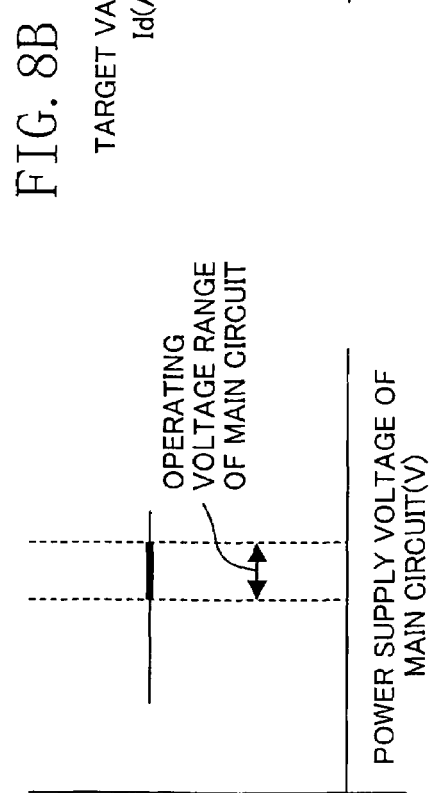

A constant current generation circuit 1-1a of FIG. 7(a) is an exemplary circuit for always keeping the target saturation current value Ids at a constant value in an operating power supply voltage range including the operating power supply voltage Vdd of the main circuit 2. The relationship between the operating power supply voltage of the present circuit and a constant current value Id (target saturation current value) of the constant current generation circuit 1-1a is shown in FIG. 8(a). The constant current generation circuit 1-1a of FIG. 7(a) includes a reference voltage generation circuit 11, an operational amplifier 21, a resistor 31 having a resistance value R and two pMOS transistors 41 and 42. A voltage Vo higher than the operating power supply voltage Vdd is supplied to the sources of the pMOS transistors 41 and 42, and one end of the resistor 31 is connected to the pMOS transistor 41, with the other end of the resistor 31 being grounded. The drain of the other pMOS transistor 42 is the output terminal of the present circuit 1-1a. The operational amplifier 21 controls the gate of the pMOS transistor 41 so that the voltage value at one end of the resistor 31 different from the grounded end is equal to an output voltage value Vr of the reference voltage generation circuit 11. The pMOS transistors 41 and 42 have the same size, and currents of the same value flow through the pMOS transistors 41 and 42, whereby the pMOS transistor 42 outputs the constant current Id (Id=Vr/R).

Figure 7B:
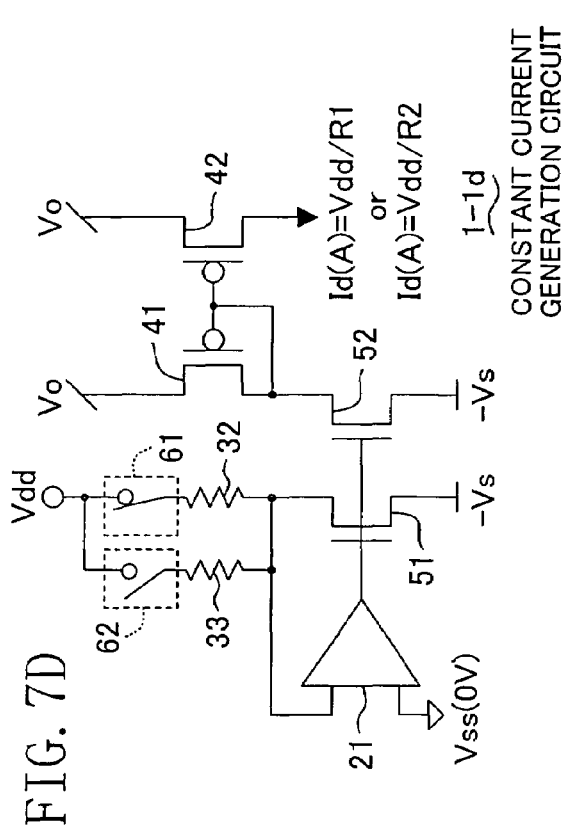
Figure 7C:
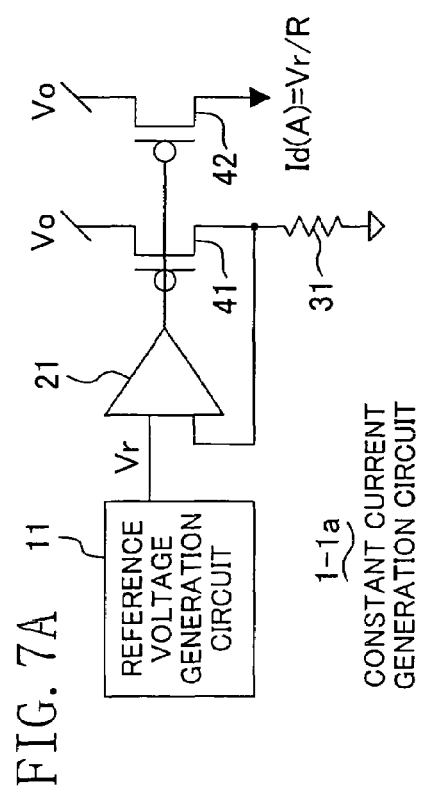
Figure 7D:
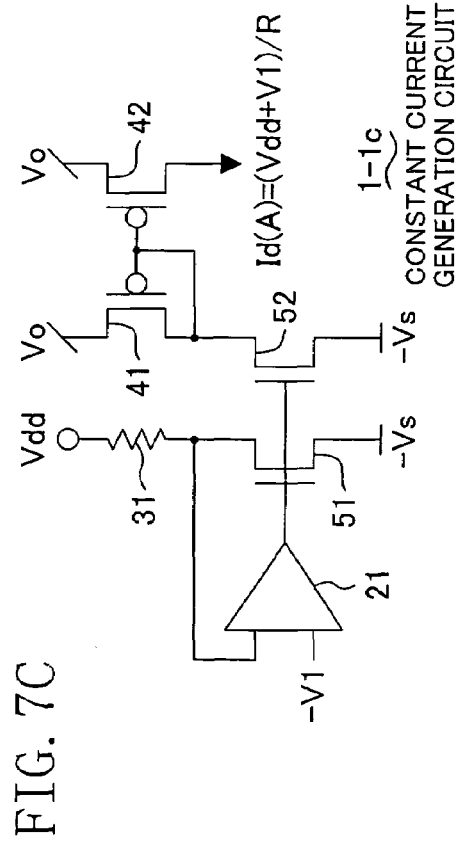

FIG. 7(b) to FIG. 7(d) show other variations of constant current generation circuits 1-1b to 1-1d. The value of the constant current Id, i.e., the target saturation current value Ids, is not always kept constant, but is changed to a plurality of values according to changes in the operating power supply voltage Vdd of the main circuit 2, and one constant voltage value is selected and output, from among the plurality of values, according to the actual operating power supply voltage Vdd of the main circuit 2.

Figure 8B:
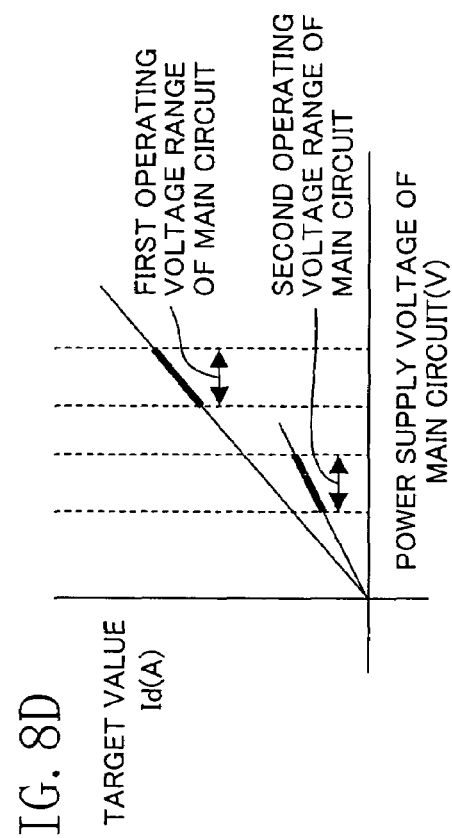

Specifically, the constant current generation circuit 1-1b of FIG. 7(b) is an exemplary circuit in which the target saturation current value Ids and the operating power supply voltage Vdd of the main circuit 2 are proportional to each other for the operating power supply voltage range of the main circuit 2. The relationship between the operating power supply voltage Vdd of the present circuit and the target saturation current value (the constant current value Id of the constant current generation circuit 1-1a) is shown in FIG. 8(b).

The constant current generation circuit 1-1b of FIG. 7(b) includes the operational amplifier 21, the resistor 31 having a resistance value R, the two pMOS transistors 41 and 42 and two nMOS transistors 51 and 52. The operating power supply voltage Vdd of the main circuit 2 is supplied to one end of the resistor 31. A voltage Vo higher than the operating power supply voltage Vdd is supplied to the sources of the pMOS transistors 41 and 42, and a predetermined negative voltage −Vs is supplied to the sources of the nMOS transistors 51 and 52. The operational amplifier 21 controls the gates of the two nMOS transistors 51 and 52 so that the other end of the resistor 31 has a ground potential Vss, i.e., 0 V. Where the nMOS transistors 51 and 52 have the same size and the pMOS transistors 41 and 42 also have the same size, currents of the same value flow through all the transistors, whereby the pMOS transistor 42 outputs the current Id (Id=Vdd/R). With the circuit shown in FIG. 7(b), the target saturation current value Id is proportional to the operating power supply voltage Vdd of the main circuit 2.

Figure 8C:
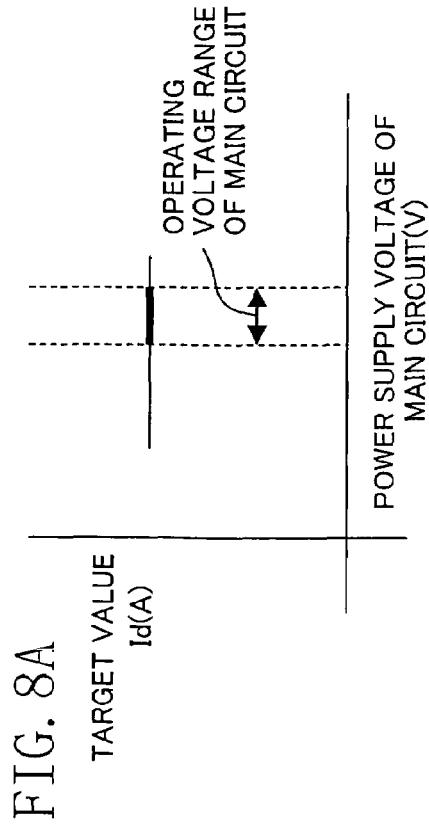

The constant current generation circuit 1-1c of FIG. 7(c) is an exemplary circuit in which the target saturation current value Ids and the power supply voltage value of the main circuit 2 are in a linear function relationship for the operating power supply voltage range of the main circuit 2. The relationship between the power supply voltage of the present circuit and the saturation current is shown in FIG. 8(c).

The constant current generation circuit 1-1c of FIG. 7(c) is substantially the same circuit as that of FIG. 7(b), except that a negative voltage −V1 is supplied to the operational amplifier 21 in FIG. 7(c) whereas the ground potential Vss is input to the operational amplifier 21 in FIG. 7(b). Therefore, in FIG. 7(c), the operational amplifier 21 controls the gates of the nMOS transistors 51 and 52 so that the other end of the resistor 31 is at the negative voltage −V1. Where the nMOS transistors 51 and 52 have the same size and the pMOS transistors 41 and 42 have the same size, currents of the same value flow through all the transistors, whereby the pMOS transistor 42 outputs the current Id (Id=(Vdd+V1)/R).

Figure 8D:
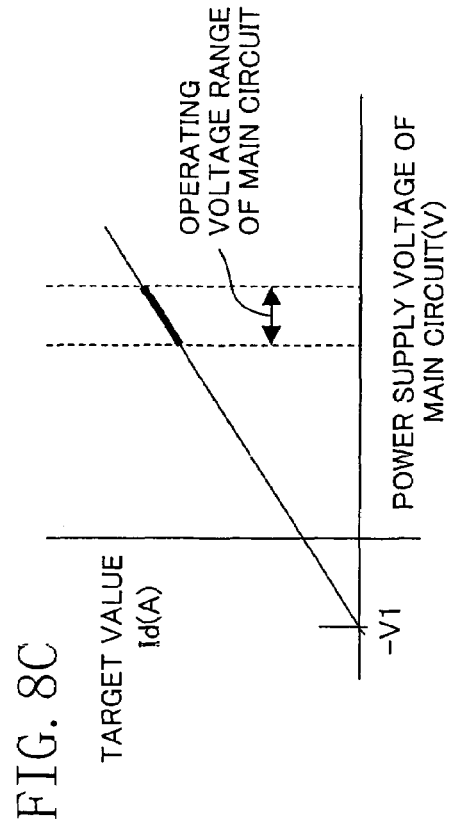

The constant current generation circuit 1-1d of FIG. 7(d) is an exemplary circuit in which for each of two or more different operating power supply voltage ranges of the main circuit, the target saturation current value Ids and the operating power supply voltage value of the main circuit 2 are in a proportional relationship, and the proportional relationship (the gradient of the linear function) is different for each operating power supply voltage range. The relationship between the operating power supply voltage of the present circuit and the saturation current is shown in FIG. 8(d).

The constant current generation circuit 1-1d of FIG. 7(d) additionally includes two resistors 32 and 33 having resistance values R1 and R2 (R1<R2) and two switches 61 and 62, as compared with the circuit of FIG. 7(b). If the first operating power supply voltage range is a high voltage range, only the switch 61 for the resistor 32 is turned ON, and if the second operating power supply voltage range is a low voltage range, only the switch 62 for the resistor 33 is turned ON. Therefore, the constant current Id (Id=Vdd/R1) is obtained in the case of the first operating voltage range and the constant current Id (Id=Vdd/R2) is obtained in the case of the second operating voltage range. Since R1<R2, characteristics as shown in FIG. 8(d) are obtained.

Providing the constant current generation circuits 1-1a to 1-1d shown in FIG. 7(a) to FIG. 7(d) as the constant current generation circuit 1-1 of FIG. 3, it is possible to realize various relationships as shown in FIG. 2(a) to FIG. 2(d).

The present invention is meaningless unless the variation rate of the target saturation current value of a MOS transistor is made smaller than that of the actual saturation current value thereof. However, resistors formed by a semiconductor process vary by about 20% depending on how successful the process was, whereby it is necessary to take some measures with the circuit.

Figure 9A:
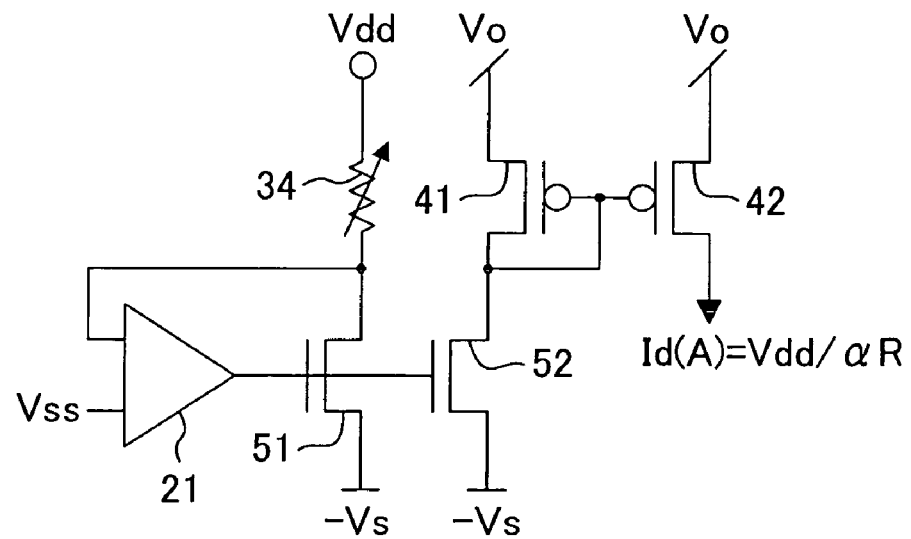
FIG. 9(a) shows an internal configuration of a constant current generation circuit capable of adjusting the output current value.
Figure 9B:
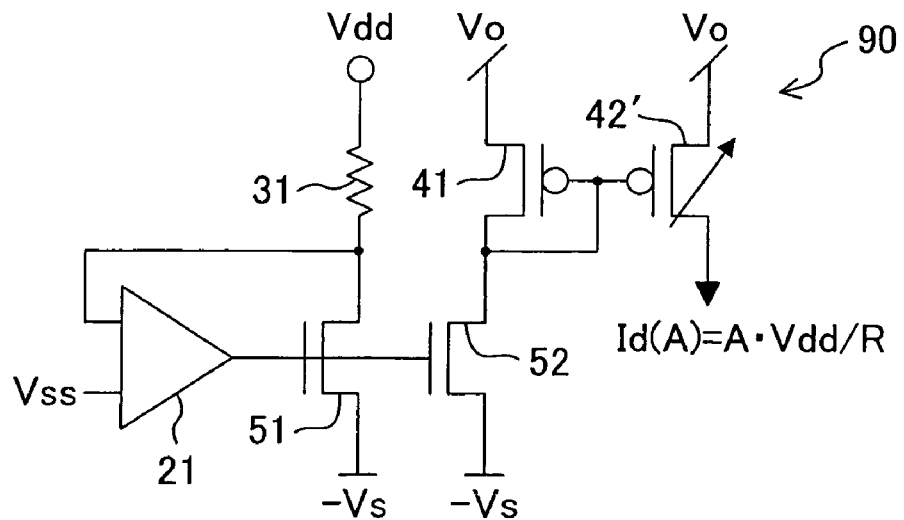
FIG. 9(b) shows a first variation of the constant current generation circuit.

FIG. 9(a) and FIG. 9(b) each show a constant current generation circuit having an adjustment circuit capable of further increasing the absolute precision of the target saturation current value Ids.

FIG. 9(a) shows a configuration of a constant current generation circuit in which the absolute precision of the resistance value is increased, thereby making it possible to adjust the output current. FIG. 9(a) is substantially the same as FIG. 7(b), except that a resistor 34 is a variable resistor. The resistance value of the variable resistor (adjustment circuit) 34 can be set to any value by adjusting the coefficient α. Therefore, the constant current Id output from the pMOS transistor 42 is Id=Vdd/αR, whereby the precision of the target saturation current value Id can be further increased by adjusting the coefficient α even if the resistance value R of the resistor 34 itself varies.

FIG. 9(b) shows a configuration of a constant current generation circuit in which the constant current Id can be adjusted by the current ratio A between two pMOS transistors 41 and 42'. The size ratio between the gate widths W of the two pMOS transistors 41 and 42' is set to be 1:A, where the coefficient A is adjustable. Therefore, the constant current value Id output from the pMOS transistor 42' whose gate width W is adjustable is Id=A·Vdd/R, whereby the precision of the target saturation current value Id can be further increased by adjusting the coefficient A even if the resistance value R of the resistor 31 itself varies. The two pMOS transistors 41 and 42' having the current ratio A together form an adjustment circuit 90 for reducing the variations in the constant current value.

With the current-voltage conversion circuit 1-3, a method in which the saturation current value Ids of a MOS transistor used in the main circuit 2 is converted to a voltage has been described. However, constantly passing a current flow of a few mA through the MOS transistor of the current-voltage conversion circuit 1-3 is electrically disadvantageous and is undesirable in terms of aging. What is important to the current-voltage conversion circuit of the present invention is that when the predetermined target saturation current value is decided, the substrate voltage-operating power supply voltage (Vb-Vdd) characteristics of the MOS transistors of the main circuit 2 and the Vb-Vd characteristics of the current-voltage conversion circuit are made substantially the same against variations in various factors.

Figure 11A:
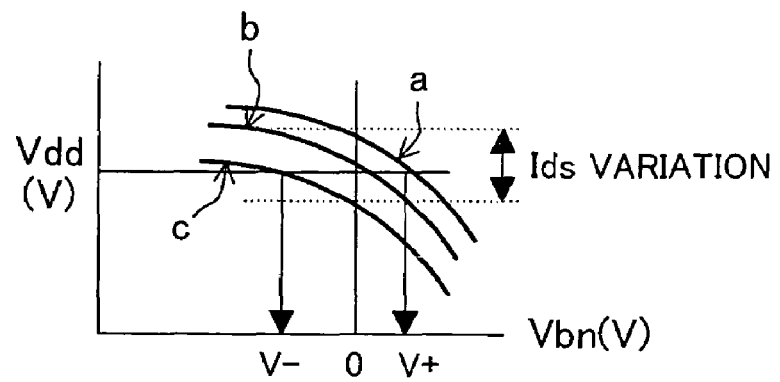
FIG. 11(a) shows the relationship between the substrate potential of a MOS transistor of the main circuit and the operating power supply voltage of the main circuit with respect to variable factors such as the temperature where the actual saturation current of the MOS transistor is controlled to be a constant value.
Figure 11B:
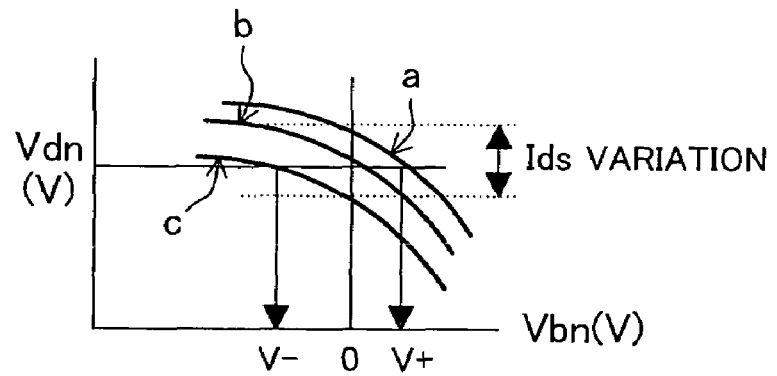
FIG. 11(b) shows the relationship between the substrate potential of a MOS transistor of the current-voltage conversion circuit and the output voltage required for the current-voltage conversion circuit with respect to variable factors such as the temperature where the saturation current of the MOS transistor is controlled to be a constant value.

FIG. 11(a) and FIG. 11(b) each show characteristics required for the current-voltage conversion circuit 1-3. FIG. 11(a) shows the relationship between the substrate potential Vbn of the NMOS transistor of the main circuit 2 and the operating power supply voltage Vdd where the target saturation current value Ids(n) is constant. The symbol "a" denotes characteristics where the threshold voltage Vt from Expression 3 above is large, the value μCox(W/L) is small or the temperature is high, the symbol "b" denotes characteristics where the threshold voltage Vt from Expression 3 above is medium, the value μCox(W/L) is medium or the temperature is medium, and the symbol "c" denotes characteristics where the threshold voltage Vt from Expression 3 above is low, the value μCox(W/L) is large or the temperature is low. It is indicated that for the predetermined operating power supply voltage Vdd, the substrate potential Vbn needs to be controlled within the range of V− to V+ against variations in various factors.

FIG. 11(b) shows the relationship between the substrate potential Vbn of the NMOS transistor provided in the current-voltage conversion circuit 1-3 and the output converted voltage Vdn where the target saturation current Idn is constant, indicating that it is sufficient that characteristics similar to those of FIG. 11(a) are realized against variations in various factors. Thus, for the predetermined converted voltage Vdn (Vdn=Vdd), it is sufficient that the substrate potential Vbn is controlled to be in the range of V− to V+ against variations in various factors.

Figure 10A:
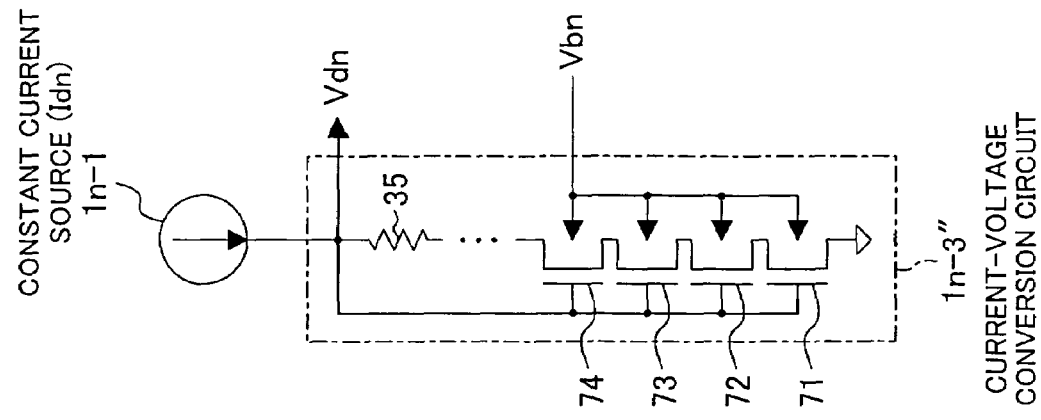
Figure 10B:
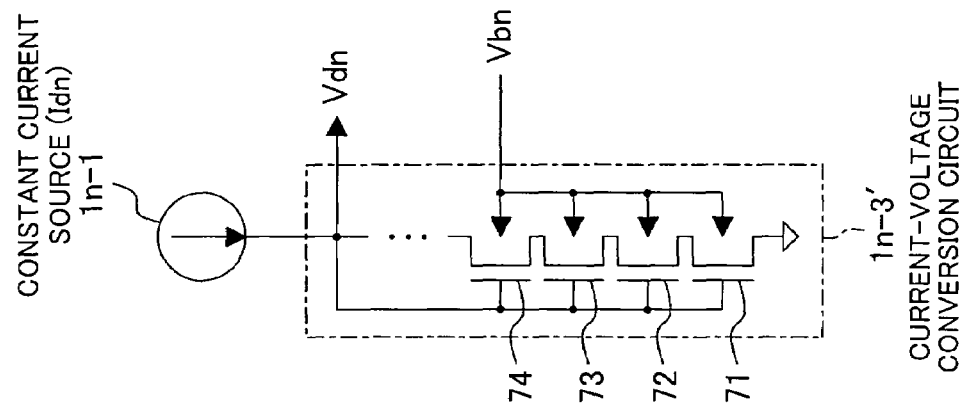
Figure 10C:
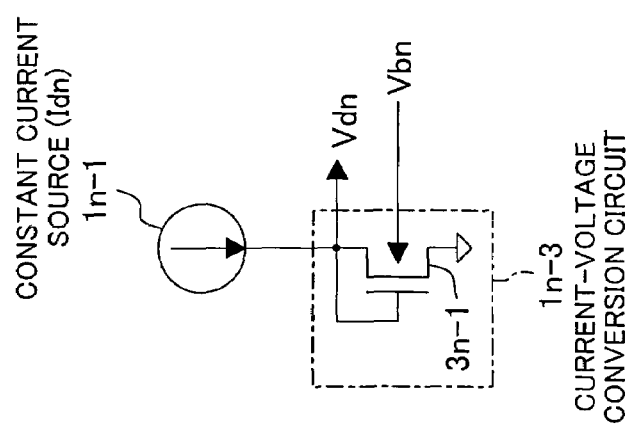

Thus, the current-voltage conversion circuit 1-3 may be substituted with the configurations shown in FIG. 10(b) and FIG. 10(c).

FIG. 10(a) shows again the current-voltage conversion circuit 1n-3, which is also shown in FIG. 5. The configuration of the current-voltage conversion circuit 1-3 is not limited to any particular configuration as long as it is the circuit configuration of FIG. 10(a), i.e., a configuration capable of substantially realizing the Vbn-Vdn characteristics against variations in various factors as shown in FIG. 11(a).

The saturation current characteristics of a MOS transistor are also dependent on the value (W/L) as indicated by Expression 3. Therefore, where the original target saturation current value is Ids(n), even if the target saturation current value Ids where the operating power supply voltage Vdd is a constant value is changed to Ids=(1/10)Ids(n) by multiplying the gate length L of the MOS transistor of the current-voltage conversion circuit 1n-3 by a factor of 10, i.e., from the original value of 0.13 μm to 1.3 μm, the Vbn-Vdn characteristics of the current-voltage conversion circuit 1n-3 do not change, whereby Ids can be used instead of (1/10)Ids(n). Note however that since the relative precisions against variations in (W/L) are different, it is preferred in terms of characteristics that the effective gate length L is set to L=1.3 μm where 10 nMOS transistors 71 to 74, . . . , having a size of 31 m/0.13 μm are stacked on one another as shown in FIG. 10(b). In practice, since the mobility μ varies due to differences in the current density, the characteristics may differ from the design characteristics of FIG. 10(a). In such a case, the characteristics can be substantially matched to each other by inserting a resistor 35 as shown in FIG. 10(c).

Figure 12C:
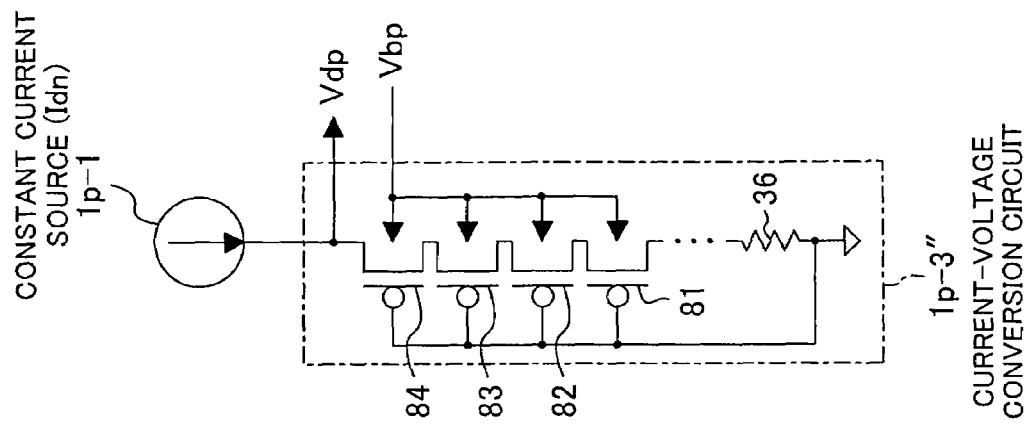
Figure 12B:
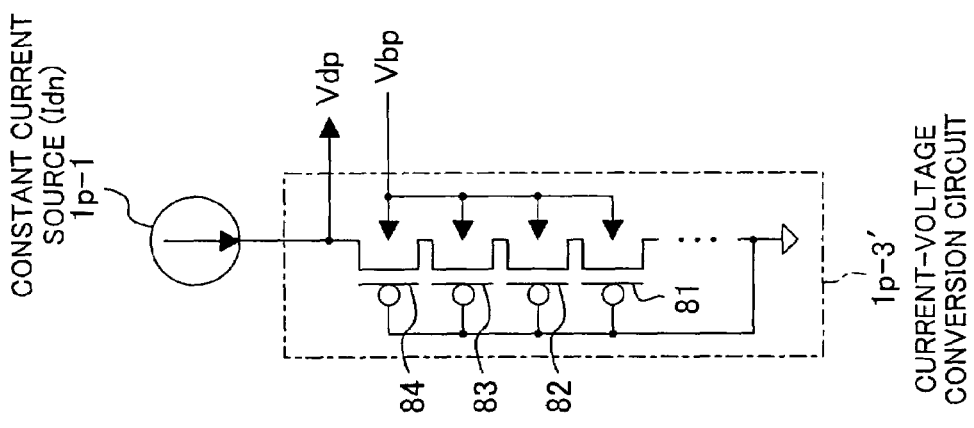
Figure 12A:
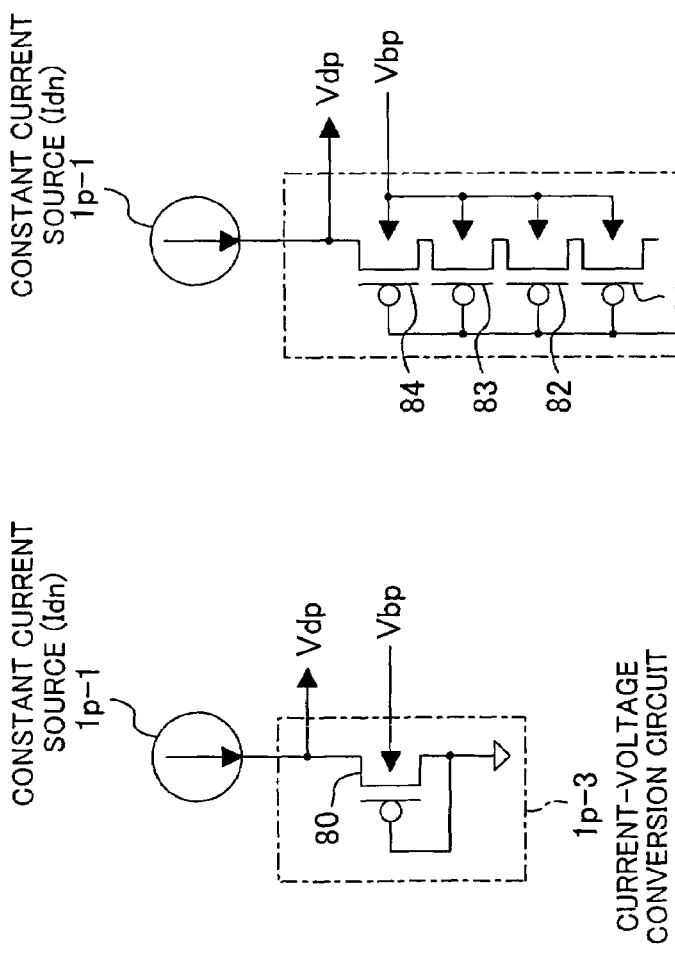
Figure 13A:
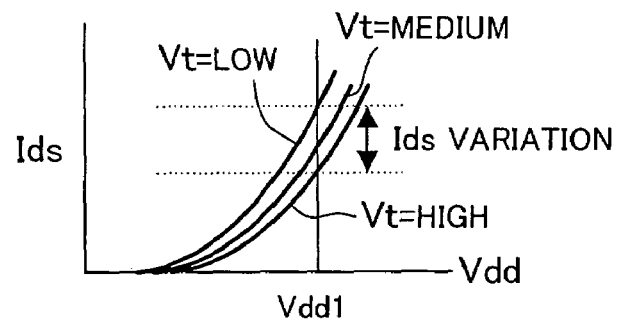
Figure 13B:
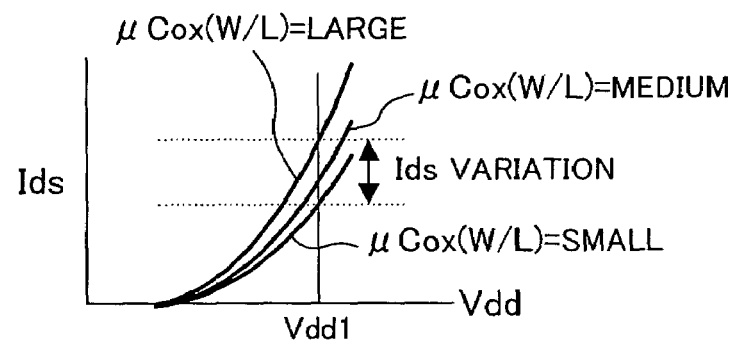
Figure 13C:
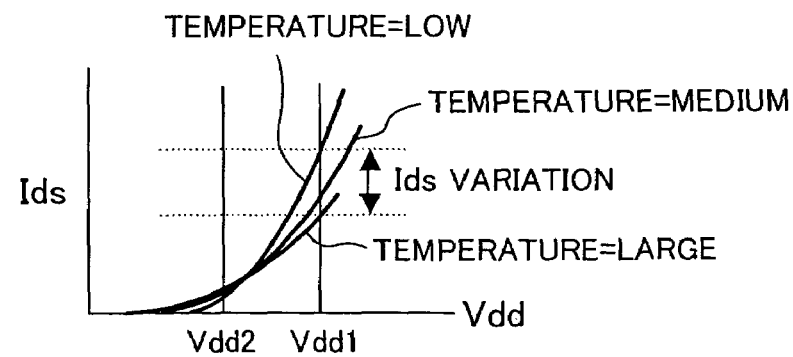
Figure 14:
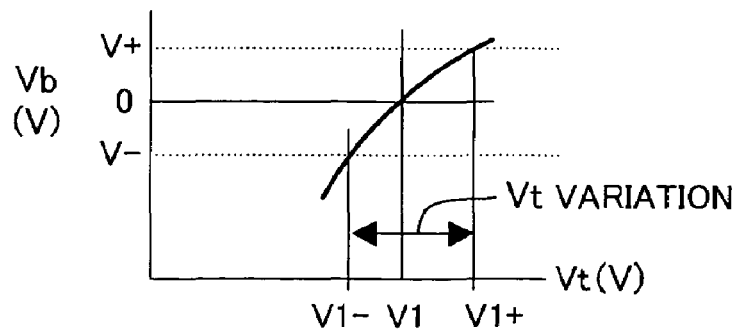
FIG. 14 shows the relationship between the threshold voltage and the substrate potential of a MOS transistor.

Next, FIG. 12(b) and FIG. 12(c) each show an exemplary circuit configuration of a current-voltage conversion circuit of a substrate potential control circuit for pMOS transistors. Each of these configurations includes 10 pMOS transistors 81 to 84, . . . , stacked on one another. The behaviors of the circuits shown in these figures are similar to those of FIG. 10(b) and FIG. 10(c), and will not be further described below.

Second Embodiment

Next, a semiconductor integrated circuit according to the second embodiment of the present invention will be described.

Figure 15:
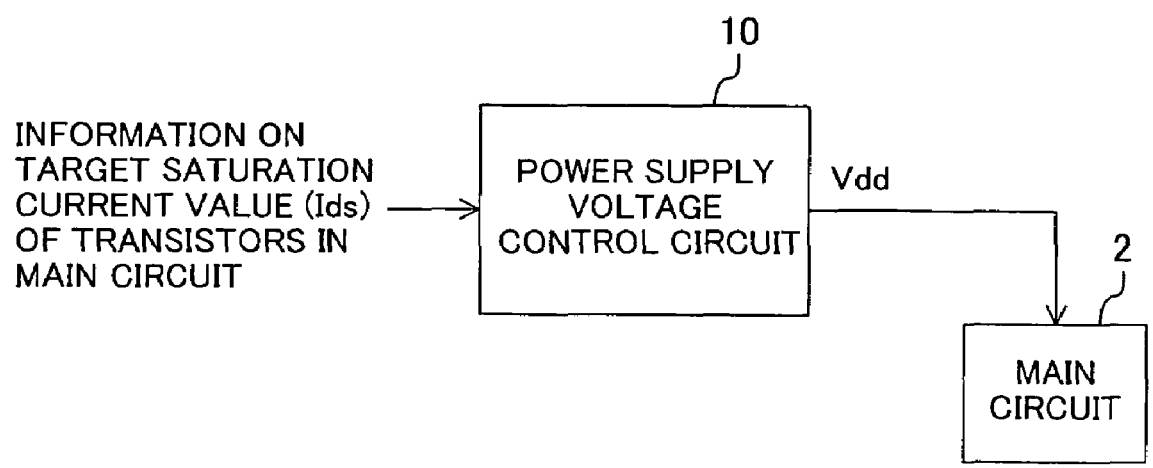
FIG. 15 shows a basic configuration of a semiconductor integrated circuit according to the second embodiment of the present invention.

FIG. 15 shows a general configuration of the semiconductor integrated circuit of the present embodiment. In the first embodiment shown in FIG. 1, the substrate potential control circuit 1 is provided so that variations in the saturation current value Ids of a MOS transistor that determines the delay time τ shown in Expression 2 are themselves suppressed by controlling the substrate potential of the MOS transistor. In the present embodiment, the variations in the saturation current value Ids are suppressed by controlling the operating power supply voltage Vdd supplied to the main circuit 2.

Specifically, in FIG. 15, reference numeral 10 denotes a power supply voltage control circuit that is receiving information on the target saturation current value Ids of the MOS transistors included in the main circuit 2. The power supply voltage control circuit 10 controls the operating power supply voltage Vdd of the main circuit 2 so that the actual saturation current of the MOS transistors in the main circuit 2 is equal to the given target saturation current value Ids. The main circuit 2 may have an internal configuration as shown in FIG. 4, for example.

Figure 16:
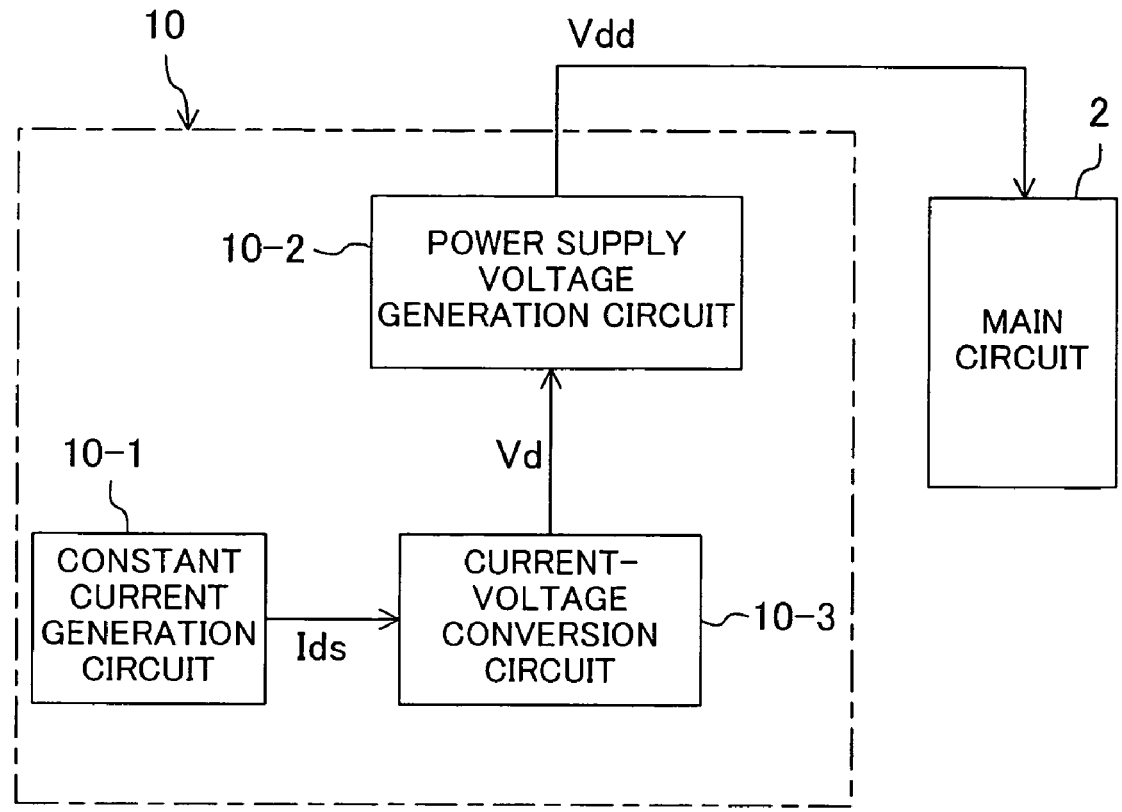
FIG. 16 shows an internal configuration of a power supply voltage control circuit provided in the semiconductor integrated circuit of the second embodiment.

FIG. 16 shows an exemplary specific configuration of the power supply voltage control circuit 10. The semiconductor integrated circuit shown in FIG. 16 includes the power supply voltage control circuit 10 and the main circuit 2, as in FIG. 15. The power supply voltage control circuit 10 includes the constant current generation circuit 10-1, a power supply voltage generation circuit 10-2 and a current-voltage conversion circuit 10-3. The constant current generation circuit 10-1 outputs a constant current Ids equal to the target saturation current value Ids, and the constant current Id is input to the current-voltage conversion circuit 10-3. The current-voltage conversion circuit 10-3 converts the constant current Ids from the constant current generation circuit 10-1 to a voltage Vd and outputs the voltage Vd as a reference voltage to the power supply voltage generation circuit 10-2. The power supply voltage generation circuit 10-2 outputs, as the operating power supply voltage Vdd, a voltage having the same voltage value as the reference voltage Vd from the current-voltage conversion circuit 10-3 while lowering the impedance thereof. The operating power supply voltage Vdd generated by the power supply voltage generation circuit 10-2 is supplied to the main circuit 2.

Thus, in the present embodiment, the power supply voltage control circuit 10 controls the operating power supply voltage Vdd of the main circuit 2 so that the actual saturation current value of the MOS transistors in the main circuit 2 is always equal to the target saturation current value Ids. Therefore, even if the mobility and the threshold voltage Vt of the MOS transistors in the main circuit 2 vary due to variations in the manufacturing process of the MOS transistors or changes in the temperature occur, variations in the operation speed of the MOS transistors of the main circuit 2 are effectively suppressed.

Figure 17:
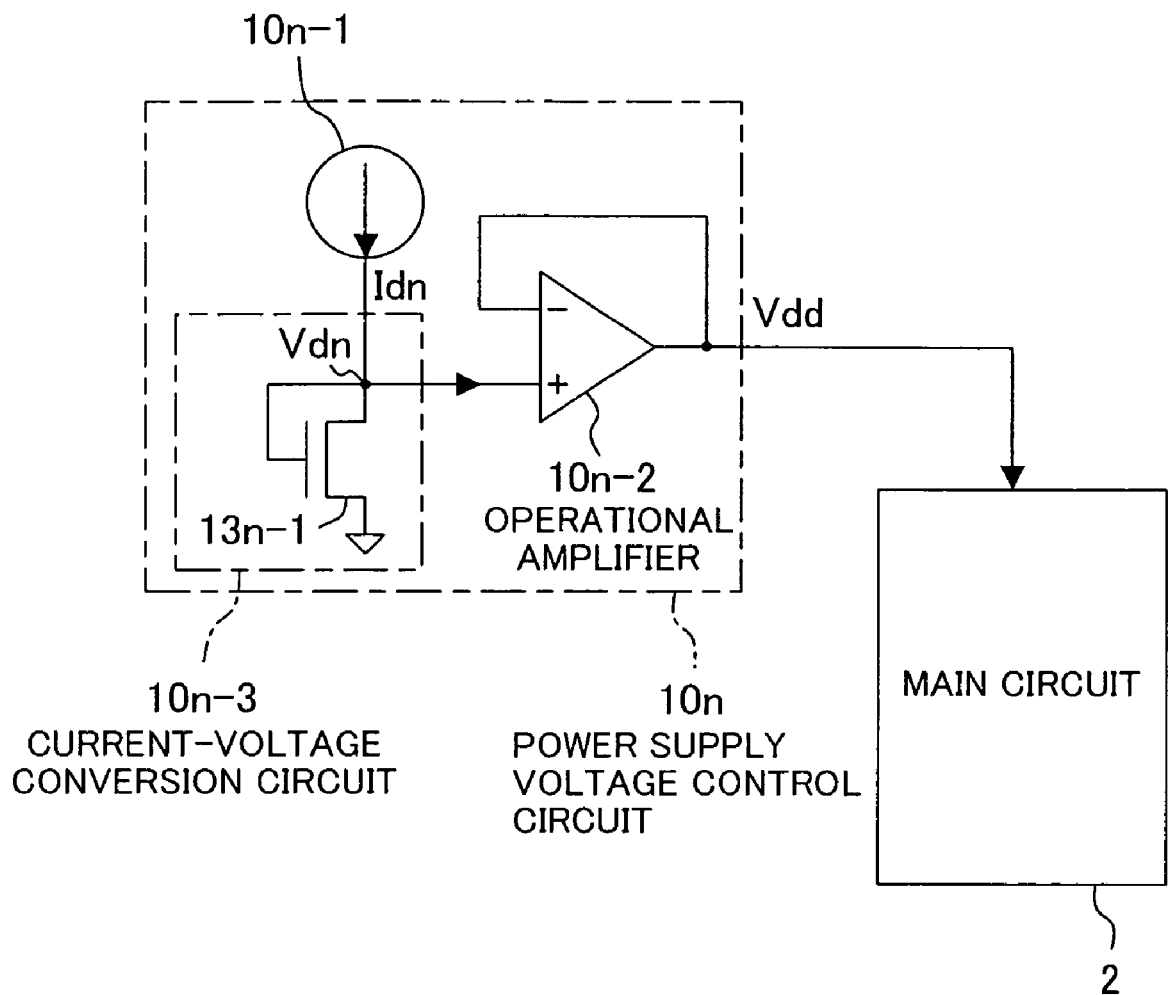
FIG. 17 shows an exemplary specific configuration of the power supply voltage control circuit.

FIG. 17 shows a specific configuration of the power supply voltage control circuit 10. A power supply voltage control circuit 10n shown in the figure includes a constant current source (constant voltage generation circuit) 10n-1, a current-voltage conversion circuit 10n-3 being an NMOS transistor 13n-1, and a power supply voltage generation circuit 10n-2 being an operational amplifier. The nMOS transistor 13n-1 of the current-voltage conversion circuit 10n-3 is a transistor having the same characteristics as those of nMOS transistors (not shown) provided in the main circuit 2. The constant current Idn equal to the target saturation current value Ids from the constant current source 10n-1 is converted by the current-voltage conversion circuit 10n-3 to the voltage Vdn, and the power supply voltage generation circuit 10n-2 supplies, as the operating power supply voltage Vdd, a voltage having the same voltage value as the voltage Vdn to the main circuit 2. Since the power supply voltage control circuit 10n includes the current-voltage conversion circuit 10n-3 being the nMOS transistor 13n-1, the configuration is particularly effective in a case where a critical path is formed depending on the driving power of the nMOS transistors among all the MOS transistors of the main circuit 2.

Figure 18:
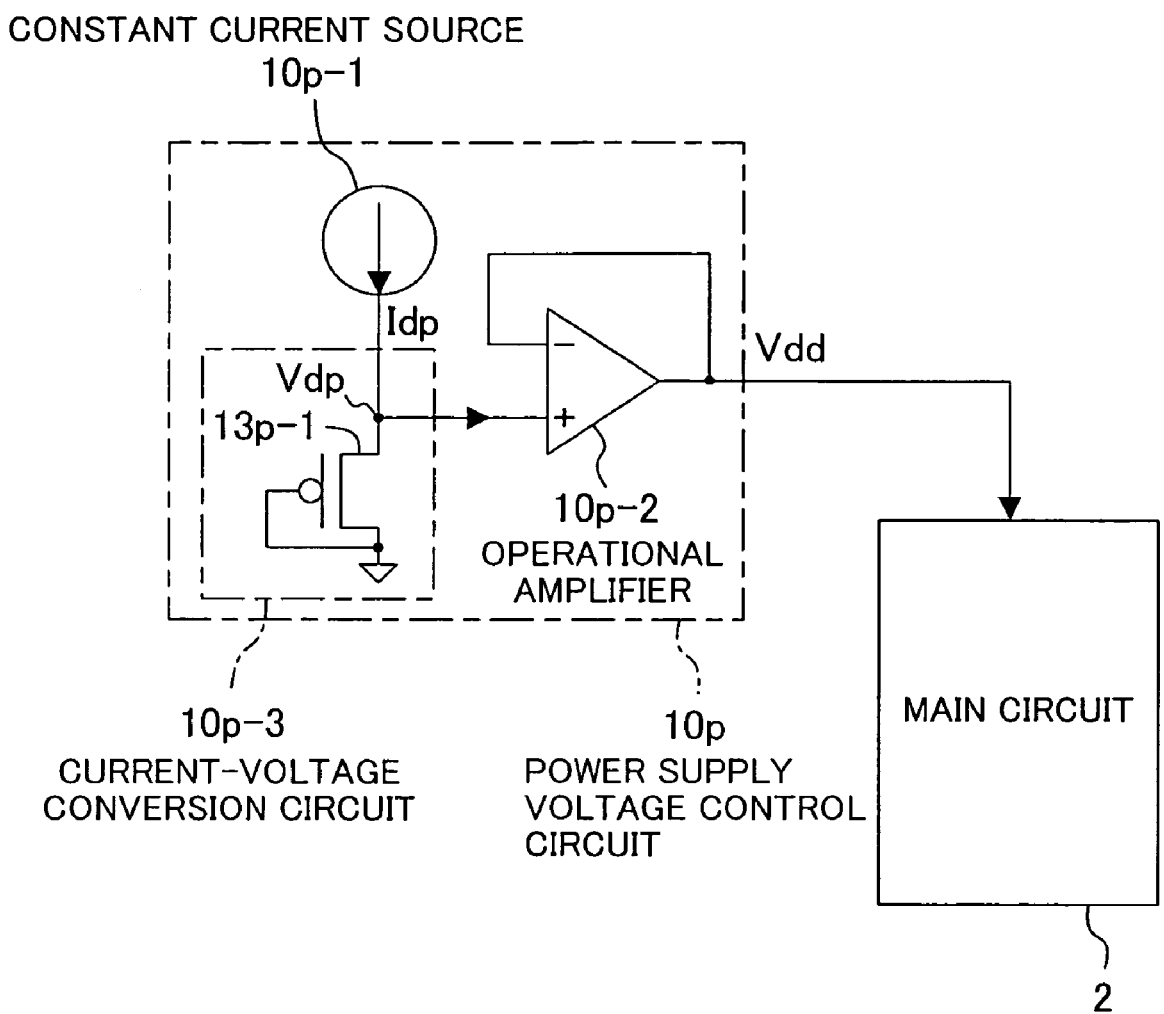
FIG. 18 shows another exemplary specific configuration of the power supply voltage control circuit.

FIG. 18 shows another specific configuration of the power supply voltage control circuit 10 shown in FIG. 16, which is particularly effective in a case where a critical path is formed depending on the driving power of the pMOS transistors among all the MOS transistors of the main circuit 2.

Specifically, in a power supply voltage control circuit 10p shown in FIG. 18, a current-voltage conversion circuit 10p-3 is a pMOS transistor 13p-1 having the same characteristics as those of the pMOS transistors (not shown) provided in the main circuit 2. Other than this, the configuration is the same as that of the power supply voltage control circuit 10n shown in FIG. 17. Therefore, like elements are given like reference numerals with a suffix "p" and will not be further described below.

Figure 19:
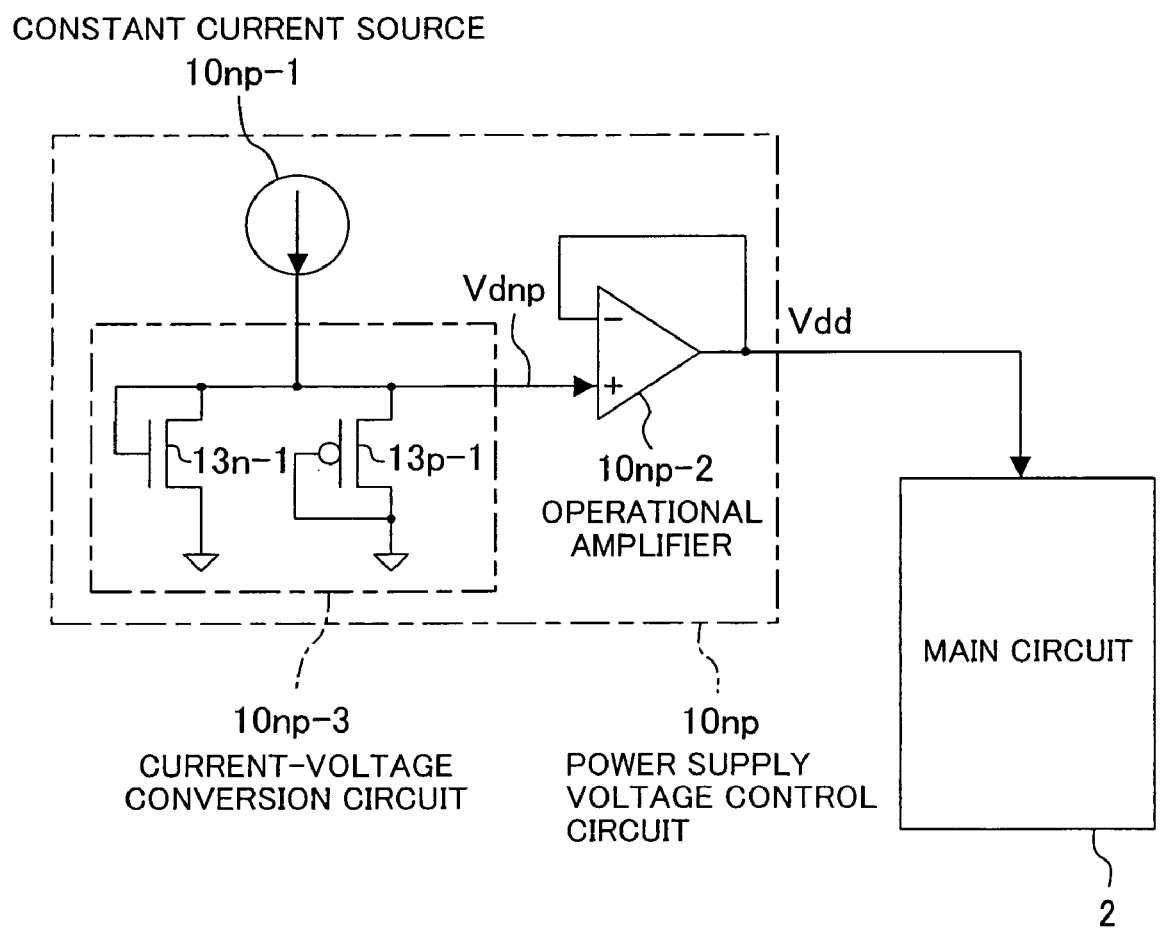
FIG. 19 shows still another exemplary specific configuration of the power supply voltage control circuit.

FIG. 19 shows still another specific configuration of the power supply voltage control circuit 10 shown in FIG. 16, which is particularly effective in a case where a critical path is formed depending on both the driving power of the nMOS transistors and that of the pMOS transistors among all the MOS transistors of the main circuit 2.

Specifically, in the power supply voltage control circuit 10p shown in FIG. 19, a current-voltage conversion circuit 10np-3 is a parallel circuit of an NMOS transistor 13n-1 and a pMOS transistor 13p-1 having the same characteristics as those of the NMOS and pMOS transistors (not shown) provided in the main circuit 2. In this case, a constant current Idnp supplied from a constant current source 10np-1 is the sum of the constant current Idn being equal to the target saturation current Idsn of the NMOS transistor and the constant current Idp being equal to the target saturation current Idsp of the pMOS transistor, and the target saturation current value Ids is the average value between the target saturation current values Idsn and Idsp of the NMOS and pMOS transistors 13n-1 and 13p-1. Other than this, the configuration is the same as that of the power supply voltage control circuit 10n shown in FIG. 17. Therefore, like elements are given like reference numerals with a suffix "np" and will not be further described below.

The configuration shown in FIG. 7(b) or FIG. 7(c) may be employed for the internal configurations of the constant current sources 10n-1, 10p-1 and 10np-1 shown in FIG. 17 to FIG. 19. With these internal configurations, the relationship between the supplied constant current value Id and the operating power supply voltage Vdd of the main circuit 2 can be a linear function as shown in FIG. 8(b) and FIG. 8(c). As can be seen from Expression 2 and Expression 5 above, with such a linear function relationship, the delay time τ can be fixed to a predetermined value, making the operation speed of the main circuit 2 stay at a constant value, independent of characteristics variations, including changes in the threshold voltage of the MOS transistors of the main circuit 2, changes in the temperature, or the operating power supply voltage Vdd of the main circuit 2. This allows for a design with a small margin for variations in the characteristics of the MOS transistors, changes in the temperature, etc., thus facilitating the design and increasing the production yield of shipped products. Moreover, as a design with a small margin is made possible, the operating power supply voltage Vdd of the main circuit 2 is set to a voltage that is determined in view of a small power supply margin. Therefore, unlike in the prior art, it is not necessary to set it to a high voltage taking into consideration a large margin in view of variations in the manufacturing process of MOS transistors, etc., whereby it is possible to make the main circuit 2 operate with an even lower operating power supply voltage Vdd and thus to reduce the power consumption.

Moreover, the configuration shown in FIG. 7(d), FIG. 9(a) or FIG. 9(b), for example, may be employed for the internal configurations of the constant current sources 10n-1, 10p-1 and 10np-1. With these internal configurations, the relationship between the target saturation current value Ids of the MOS transistors of the main circuit 2 and the operating power supply voltage Vdd for each operating power supply voltage range corresponding to one operation mode of the main circuit 2 can be a linear function as shown in FIG. 8(d), with the gradient of the linear function being different for each operating power supply voltage range of the main circuit 2. In such a case, since the operating power supply voltage Vdd taking into consideration only a small power supply margin can be used for each operation mode of the main circuit 2, the main circuit 2 can operate at a lower voltage in all operation modes, whereby it is possible to further reduce the power consumption.

INDUSTRIAL APPLICABILITY

As described above, according to the present invention, the actual saturation current value of the MOS transistors of the main circuit is controlled to be equal to a target saturation current value, whereby it is possible to suppress variations in the operation of the main circuit, irrespective of variations in the manufacturing process of the MOS transistors such as the threshold voltage, the gate capacitance per unit area and the W/L ratio or changes in the ambient temperature. Thus, the present invention is useful for providing, for example, semiconductor integrated circuits with an improved production yield and an improved operation speed.

The invention claimed is:

1. A semiconductor integrated circuit, comprising:
a main circuit including a plurality of MOS transistors in which a source potential and a substrate potential are separated from each other, and operating while receiving an operating power supply voltage; and
a substrate potential control circuit for controlling the substrate potential of a MOS transistor in the main circuit so that a saturation current value of the MOS transistor is equal to a target saturation current value, the substrate potential control circuit, including:
a constant current generation circuit;
a current-voltage conversion circuit including a MOS transistor provided therein and having current-voltage conversion characteristics that change according to the substrate potential of the MOS transistor provided therein for converting a constant current value of the constant current generation circuit to a voltage value; and
a differential amplifier circuit comparing the voltage value generated by the current-voltage conversion circuit with the operating power supply voltage and outputting a voltage for controlling the substrate potential of the current-voltage conversion circuit so that the voltage value generated by the current-voltage conversion circuit is equal to the operating power supply voltage value of the main circuit,
wherein the substrate potential control circuit controls a substrate potential of a MOS transistor in the main circuit, and
the constant current generation circuit generates a plurality of constant current values, and selectively outputs one of the plurality of constant current values.

2. A semiconductor integrated circuit, comprising:
a main circuit including a plurality of MOS transistors in which a source potential and a substrate potential are separated from each other, and operating while receiving an operating power supply voltage; and
a substrate potential control circuit for controlling the substrate potential of a MOS transistor in the main circuit so that a saturation current value of the MOS transistor is equal to a target saturation current value, the substrate potential control circuit, including:
a constant current generation circuit;
a current-voltage conversion circuit including a MOS transistor provided therein and having current-voltage conversion characteristics that change according to the substrate potential of the MOS transistor provided therein for converting a constant current value of the constant current generation circuit to a voltage value; and
a differential amplifier circuit comparing the voltage value generated by the current-voltage conversion circuit with the operating power supply voltage and outputting a voltage for controlling the substrate potential of the current-voltage conversion circuit so that the voltage value generated by the current-voltage conversion circuit is equal to the operating power supply voltage value of the main circuit,
wherein the substrate potential control circuit controls a substrate potential of a MOS transistor in the main circuit,
the constant current generation circuit generates a constant current with a variation rate smaller than that for the saturation current value of the MOS transistors of the main circuit, and
the constant current generation circuit includes an adjustment circuit for reducing variations in the generated constant current value.

3. A semiconductor integrated circuit, wherein comprising:
a main circuit including a MOS transistor, and operating while receiving an operating power supply voltage; and
a power supply voltage control circuit for controlling the operating power supply voltage supplied to the main circuit, wherein:
a target saturation current value of the MOS transistors is set in the power supply voltage control circuit;
the power supply voltage control circuit controls a voltage value of the operating power supply voltage supplied to the main circuit so that an actual saturation current value of the MOS transistors of the main circuit is equal to the target saturation current value; and
the target saturation current value of the MOS transistors of the main circuit is in a linear function relationship with the operating power supply voltage supplied to the main circuit.

4. A semiconductor integrated circuit, wherein: comprising:
a main circuit including a MOS transistor, and operating while receiving an operating power supply voltage; and
a power supply voltage control circuit for controlling the operating power supply voltage supplied to the main circuit, wherein:
a target saturation current value of the MOS transistors is set in the power supply voltage control circuit;
the power supply voltage control circuit controls a voltage value of the operating power supply voltage supplied to the main circuit so that an actual saturation current value of the MOS transistors of the main circuit is equal to the target saturation current value; and
the main circuit includes a plurality of operating power supply voltage ranges;
the target saturation current value of the MOS transistors of the main circuit is in a linear function relationship with an operating power supply voltage value within an operating voltage range for each operating power supply voltage range of the main circuit;
the linear function relationship between the target saturation current value and the operating power supply voltage value is different for each operating power supply voltage range.

5. The semiconductor integrated circuit of claim 3, wherein the target saturation current value of the MOS transistors of the main circuit is a target saturation current value of an nMOS transistor or that of a pMOS transistor from among the MOS transistors of the main circuit, or is an average value between the target saturation current values of the nMOS and pMOS transistors.

* * * * *

UNITED STATES PATENT AND TRADEMARK OFFICE
CERTIFICATE OF CORRECTION

PATENT NO. : 7,498,865 B2
APPLICATION NO. : 10/511165
DATED : March 3, 2009
INVENTOR(S) : Shiro Sakiyama et al.

Page 1 of 1

It is certified that error appears in the above-identified patent and that said Letters Patent is hereby corrected as shown below:

On the title page, in Item "(75) Inventors", change the cities of residence for the three inventors as follows:

"Shiro Sakiyama, Yawata (JP)" to --Shiro Sakiyama, Kyoto (JP)--;
"Masayoshi Kinoshita, Settsu (JP)" to --Masayoshi Kinoshita, Osaka (JP)--;
"Masaya Sumita, Amagasaki (JP)" to --Masaya Sumita, Hyogo (JP)--; and In Item "(87) PCT Pub. Date:", change "Oct. 9, 2004" to --September 10, 2004--.

Signed and Sealed this

Thirtieth Day of June, 2009

JOHN DOLL
*Acting Director of the United States Patent and Trademark Office*